United States Patent
Arisawa et al.

(10) Patent No.: US 11,078,361 B2
(45) Date of Patent: Aug. 3, 2021

(54) RESIN COMPOSITION, METHOD FOR PRODUCING RESIN COMPOSITION, PREPREG, FILM WITH RESIN, METAL FOIL WITH RESIN, METAL-CLAD LAMINATE, AND WIRING BOARD

(71) Applicant: PANASONIC INTELLECTUAL PROPERTY MANAGEMENT CO., LTD., Osaka (JP)

(72) Inventors: Tatsuya Arisawa, Fukushima (JP); Hirohisa Goto, Fukushima (JP); Tomoyuki Abe, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 81 days.

(21) Appl. No.: 16/332,259

(22) PCT Filed: Oct. 10, 2017

(86) PCT No.: PCT/JP2017/036606
§ 371 (c)(1),
(2) Date: Mar. 11, 2019

(87) PCT Pub. No.: WO2018/074278
PCT Pub. Date: Apr. 26, 2018

(65) Prior Publication Data
US 2019/0203045 A1    Jul. 4, 2019

(30) Foreign Application Priority Data

Oct. 17, 2016 (JP) .............................. JP2016-203510
Jan. 11, 2017 (JP) .............................. JP2017-002290

(51) Int. Cl.
*C08L 71/12* (2006.01)
*C08L 63/04* (2006.01)
(Continued)

(52) U.S. Cl.
CPC ............ *C08L 71/126* (2013.01); *B32B 15/08* (2013.01); *B32B 27/00* (2013.01);
(Continued)

(58) Field of Classification Search
CPC ..... B32B 15/08; B32B 27/00; B32B 2255/26; B32B 2363/00; B32B 2371/00;
(Continued)

(56) References Cited

U.S. PATENT DOCUMENTS 9,708,468 B2    7/2017  Kitai et al.
2013/0126217 A1  5/2013  Yamaguchi et al.
(Continued)

FOREIGN PATENT DOCUMENTS

CN    102858839 A    1/2013
CN    105358624 A    2/2016
(Continued)

OTHER PUBLICATIONS

International Preliminary Report on Patentability in International Patent Application No. PCT/JP2017/036606, dated Apr. 23, 2019.

*Primary Examiner* — David T Karst
(74) *Attorney, Agent, or Firm* — Greenblum & Bernstein, P.L.C.

(57) ABSTRACT

One aspect of the present invention is a resin composition containing a thermosetting resin, a curing agent that reacts with the thermosetting resin, and a flame retardant, in which the flame retardant contains a compatible phosphorus compound that is compatible with a mixture of the thermosetting resin and the curing agent, and a non-compatible phosphorus compound that is not compatible with the mixture, a content of the compatible phosphorus compound is 1 to 3.5 parts by mass per 100 parts by mass of a total of the thermosetting resin and the curing agent, and a content of the non-compatible phosphorus compound is 14 to 30 parts by mass (Continued)

per 100 parts by mass of the total of the thermosetting resin and the curing agent.

12 Claims, 6 Drawing Sheets

(51) Int. Cl.
| | | |
|---|---|---|
| *C08G 65/332* | (2006.01) | |
| *C08J 5/24* | (2006.01) | |
| *C08G 59/06* | (2006.01) | |
| *C08G 59/40* | (2006.01) | |
| *H05K 1/03* | (2006.01) | |
| *B32B 15/08* | (2006.01) | |
| *C08F 290/06* | (2006.01) | |
| *C08G 59/68* | (2006.01) | |
| *B32B 27/00* | (2006.01) | |
| *C08J 5/10* | (2006.01) | |
| *C08L 101/00* | (2006.01) | |
| *C08K 5/3492* | (2006.01) | |
| *C08L 63/00* | (2006.01) | |
| *C08K 5/49* | (2006.01) | |
| *C08K 5/5313* | (2006.01) | |
| *C08K 5/00* | (2006.01) | |
| *C08K 5/5399* | (2006.01) | |

(52) U.S. Cl.
CPC ........ *C08F 290/062* (2013.01); *C08G 59/063* (2013.01); *C08G 59/4014* (2013.01); *C08G 59/686* (2013.01); *C08G 65/3322* (2013.01); *C08J 5/10* (2013.01); *C08J 5/24* (2013.01); *C08K 5/34924* (2013.01); *C08K 5/49* (2013.01); *C08L 63/00* (2013.01); *C08L 63/04* (2013.01); *C08L 101/00* (2013.01); *H05K 1/03* (2013.01); *H05K 1/0353* (2013.01); *B32B 2255/26* (2013.01); *B32B 2307/3065* (2013.01); *B32B 2363/00* (2013.01); *B32B 2371/00* (2013.01); *B32B 2457/08* (2013.01); *C08J 2371/12* (2013.01); *C08J 2463/00* (2013.01); *C08K 5/0066* (2013.01); *C08K 5/5313* (2013.01); *C08K 5/5399* (2013.01); *C08L 2201/02* (2013.01)

(58) Field of Classification Search
CPC ......... B32B 2307/3065; B32B 2457/08; C08F 290/062; C08G 59/063; C08G 59/4014; C08G 59/686; C08G 65/3322; C08J 5/10; C08J 5/24; C08J 2463/00; C08J 2371/12; C08K 5/34924; C08K 5/49; C08K 5/5313; C08K 5/0066; C08K 5/5399; C08L 63/00; C08L 63/04; C08L 101/00; C08L 71/126; C08L 2201/02; H05K 1/03; H05K 1/0353
USPC ....................................................... 523/400
See application file for complete search history.

(56) References Cited

U.S. PATENT DOCUMENTS

| 2016/0060429 A1 | 3/2016 | Kitai et al. |
| 2016/0369042 A1 | 12/2016 | Nii et al. |

FOREIGN PATENT DOCUMENTS

| JP | 2014-019740 | 2/2014 |
| JP | 2014-198778 | 10/2014 |
| JP | 2015-086329 | 5/2015 |
| WO | 2015/064064 | 5/2015 |

RESIN COMPOSITION, METHOD FOR PRODUCING RESIN COMPOSITION, PREPREG, FILM WITH RESIN, METAL FOIL WITH RESIN, METAL-CLAD LAMINATE, AND WIRING BOARD

TECHNICAL FIELD

The present invention relates to a resin composition, a method for producing a resin composition, a prepreg, a film with a resin, a metal foil with a resin, a metal-clad laminate, and a wiring board.

BACKGROUND ART

Thermosetting resins are generally superior to thermoplastic resins in heat resistance and also in other characteristics, such as electrical insulation and dimensional stability. For this reason, thermosetting resins are widely used as a substrate material which forms an insulating layer of a printed wiring board.

On the other hand, when used as a molding material for substrate materials, thermosetting resins are required to be excellent not only in heat resistance but also in flame retardancy. From this point, a halogen-based flame retardant such as a bromine-based flame retardant and a halogen-containing compound such as a halogen-containing epoxy resin have been generally compounded in a resin composition used as a molding material such as a substrate material in many cases.

However, the resin composition compounded with such a halogen-containing compound will contain halogen in its cured product, and there is a risk of producing harmful substances such as hydrogen halide at the time of combustion. Thus, there is a concern indicating that such harmful substances adversely affect the human body and the natural environment. Under such circumstances, molding materials such as substrate materials are required not to contain halogen, i.e., a so-called halogen-free material is demanded.

As a resin composition containing a halogen-free flame retardant enabling to realize the "halogen-free", for example, a resin composition described in Patent Literature 1 can be mentioned.

Patent Literature 1 describes a resin composition containing a polyphenylene ether compound having a weight average molecular weight of 500 to 5000, an epoxy compound having at least two epoxy groups in one molecule, a cyanate ester compound, and a flame retardant, in which the flame retardant contains a compatible phosphorus compound that is compatible with a mixture of the polyphenylene ether compound, the epoxy compound, and the cyanate ester compound, and an non-compatible phosphorus compound that is not compatible with the mixture. Patent Literature 1 discloses that a resin composition whose cured product is excellent in heat resistance and flame retardancy can be obtained while maintaining excellent dielectric properties of the polyphenylene ether.

In order to cope with the progress of mounting technologies such as high integration of semiconductor devices, high density of wirings, and multilayering, demands for various characteristics are further increased on the substrate materials for constituting substrates of wiring boards. Specifically, cured products are required to be further high in heat resistance and flame retardancy, and to be excellent in interlayer adhesion.

CITATION LIST

Patent Literature

Patent literature 1: JP-A-2015-86329

SUMMARY OF INVENTION

It is an object of the present invention to provide a resin composition whose cured product is excellent in heat resistance, flame retardancy, and interlayer adhesion, and a method for producing the resin composition. Another object of the present invention is to provide a prepreg, a film with a resin, a metal foil with a resin, a metal-clad laminate, and a wiring board each including the resin composition.

One aspect of the present invention is a resin composition comprising a thermosetting resin, a curing agent that reacts with the thermosetting resin, and a flame retardant, wherein the flame retardant contains a compatible phosphorus compound that is compatible with a mixture of the thermosetting resin and the curing agent, and a non-compatible phosphorus compound that is not compatible with the mixture, a content of the compatible phosphorus compound is 1 to 3.5 parts by mass per 100 parts by mass of a total of the thermosetting resin and the curing agent, and a content of the non-compatible phosphorus compound is 14 to 30 parts by mass per 100 parts by mass of the total of the thermosetting resin and the curing agent.

These and other objects, features, and advantages of the present invention will become apparent from the following detailed description and the accompanying drawings.

DESCRIPTION OF EMBODIMENTS

Figure 1:
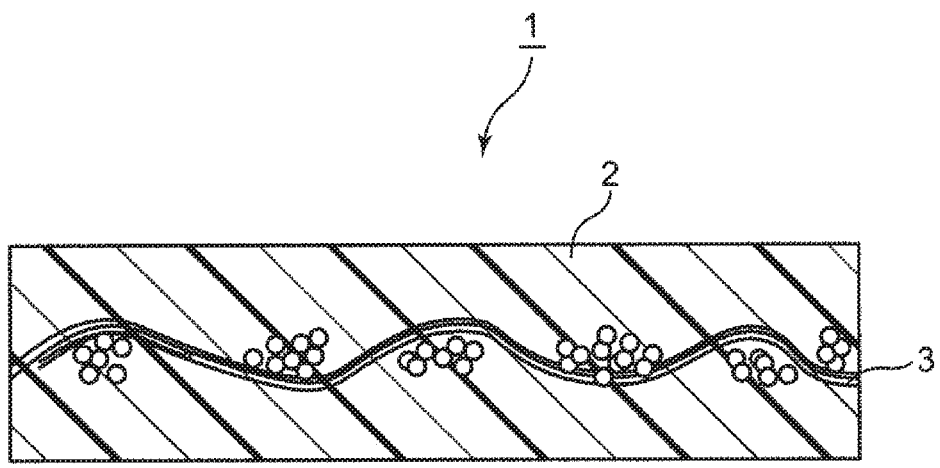
FIG. 1 is a schematic cross-sectional view showing an example of a prepreg according to an embodiment of the present invention.

In order to cope with the progress of mounting technologies such as high integration of semiconductor devices, high density of wirings, and multilayering, demands for various characteristics are further increased on the substrate materials for constituting base materials of wiring boards. Specifically, a cured product is required to be further high in heat resistance and flame retardancy.

In order to enhance the flame retardancy of the cured product of the resin composition, an increase in the content of the flame retardant in the resin composition is considered. In the case where the flame retardancy of the cured product of the resin composition is enhanced by using a phosphorus-containing compound in the molecule as the flame retardant, it is considered to be effective to increase the content of phosphorus atoms in the resin composition by increasing the content of the flame retardant in the resin composition.

However, according to investigations by the present inventors, if only the content of the flame retardant is merely increased, there may be a case where any of various performances such as dielectric properties of the resin composition, heat resistance of the cured product, and interlayer adhesion decreases. Therefore, as a result of various investigations, the present inventors have found that the composition of the flame retardant influences these performances. As a result of further investigations, the present inventors have found that the above object can be achieved by the following present invention. In other words, the present inventors have found that by combining specific different phosphorus compounds and further adjusting their contents, a resin composition whose cured product is high in flame retardancy and is also excellent in interlayer adhesion can be obtained beyond the effect expected from the content of phosphorus atoms in the resin composition.

Hereinafter, embodiments according to the present invention will be described, but the present invention is not limited thereto.

The resin composition according to an embodiment of the present invention contains a thermosetting resin, a curing agent that reacts with the thermosetting resin, and a flame retardant. The flame retardant contained in the resin composition contains a compatible phosphorus compound that is compatible with a mixture of the thermosetting resin and the curing agent, and a non-compatible phosphorus compound that is not compatible with the mixture.

First, the thermosetting resin used in this embodiment is not particularly limited as long as it is a resin having a thermosetting property. Specific examples of the thermosetting resin include thermosetting resins contained in a resin composition used for producing a wiring board such as a printed wiring board. More specifically, examples of the thermosetting resin include epoxy compounds such as epoxy resins; phenol resins; benzoxazine resins; imide resins; polyphenylene ether compounds; modified polyphenylene ether compounds; and the like. These thermosetting resins may be used singly or in combination of two or more thereof.

With an increase in an amount of information processing, mounting technologies of various electronic devices, such as high integration of semiconductor devices to be mounted, high density of wiring, and multilayering are progressing rapidly. A substrate material for constituting a base material of a wiring board used in various electronic devices is required to have a low dielectric constant and a low dielectric loss tangent in order to increase signal transmission speed and to reduce loss during signal transmission.

It has been known that polyphenylene ether (PPE) is excellent in dielectric properties such as dielectric constant and dielectric loss tangent, and is also excellent in dielectric properties such as dielectric constant and dielectric loss tangent in a high frequency band (high frequency region) from the MHz band to the GHz band. For this reason, polyphenylene ether has been studied for use, for example, as a molding material for high frequency. More specifically, polyphenylene ether is preferably used as a substrate material for constituting a base material of a wiring board provided in electronic devices using a high frequency band.

From the above description, it is preferable that the thermosetting resin contains a polyphenylene ether component. Specifically, as the thermosetting resin, a mixture of a polyphenylene ether compound and an epoxy compound, a modified polyphenylene ether compound, and the like are preferable.

The epoxy compound is not particularly limited as long as it is an epoxy compound used as a raw material for various substrates which can be used for producing laminated boards and circuit boards. Specific examples of the epoxy compound include a bisphenol type epoxy compound such as a bisphenol A type epoxy compound; a phenol novolac type epoxy compound; a cresol novolac type epoxy compound; a dicyclopentadiene type epoxy compound; a bisphenol A novolac type epoxy compound; a biphenyl aralkyl type epoxy compound; a naphthalene ring-containing epoxy compound; and the like. Among them, the epoxy compound is preferably a bisphenol type epoxy compound, a phenol novolac type epoxy compound, a cresol novolac type epoxy compound, a dicyclopentadiene type epoxy compound, or a bisphenol A novolac type epoxy compound. The epoxy compound also includes an epoxy resin which is a polymer of each of the epoxy compounds.

The phenol resin is not particularly limited as long as it is a phenol resin used as a raw material for various substrates which can be used for producing laminated boards or circuit boards. Specific examples of the phenol resin include phenol novolac resins, cresol novolac resins, aromatic hydrocarbon formaldehyde resin, modified phenol resins, dicyclopentadiene-phenol adduct resins, phenol aralkyl resins, cresol aralkyl resins, naphthol aralkyl resins, biphenyl-modified phenol aralkyl resins, phenol trimethylol methane resins, tetraphenylol ethane resins, naphthol novolac resins, naphthol-phenol co-condensed novolac resins, naphthol-cresol co-condensed novolac resins, biphenyl-modified phenol resins, aminotriazine-modified phenol resins, and the like.

The benzoxazine compound is not particularly limited as long as it is a compound having a benzoxazine ring in the molecule. Specific examples of the benzoxazine compound include P-d type benzoxazine compounds, which are made from a diamine compound, a phenol compound, and formaldehyde as raw materials; and F-a type benzoxazine compounds, which are made from a bisphenol compound, aniline, and formaldehyde as raw materials.

Examples of the imide resins include maleimide compounds having thermosetting properties by addition polymerization. Specific examples of the maleimide compounds include polyfunctional maleimide compounds having two or more maleimide groups in the molecule.

The polyphenylene ether compound is not particularly limited as long as it is a compound having a polyphenylene ether chain in the molecule. Examples of the polyphenylene ether compound include compounds having a polyphenylene ether chain in the molecule and having a phenolic hydroxyl group at the molecular terminal.

Examples of the modified polyphenylene ether include compounds in which the terminal hydroxyl group of the polyphenylene ether compound is substituted with a functional group containing an unsaturated double bond or another reactive functional group such as an epoxy group.

The curing agent is a compound that is involved in curing reaction together with the thermosetting resin to form a cured product. That is, the curing agent is a compound having reactivity with the thermosetting resin. The curing agent suitable for the type of the thermosetting resin compound to be used can be selected.

As mentioned above, the flame retardant contains a compatible phosphorus compound that is compatible with a mixture of the thermosetting resin and the curing agent, and a non-compatible phosphorus compound that is not compatible with the mixture.

The compatible phosphorus compound is not particularly limited as long as it is a phosphorus compound acting as a flame retardant and compatible with the mixture. Here, the term "compatible" refers to a state where the phosphorus compound is finely dispersed, for example, at a molecular level in the mixture of the thermosetting resin and the curing agent. Examples of the compatible phosphorus compound include a compound containing phosphorus and not forming a salt, such as a phosphoric acid ester compound, a phosphazene compound, a phosphorous acid ester compound, and a phosphine compound. Examples of the phosphazene compound include cyclic or linear chain phosphazene compounds. The cyclic phosphazene compound, which is also called cyclophosphazene, is a compound having a double bond of phosphorus and nitrogen as constituent elements in the molecule, and having a cyclic structure. Examples of the phosphoric acid ester compound include triphenyl phosphate, tricresyl phosphate, xylenyl diphenyl phosphate, cresyl diphenyl phosphate, 1,3-phenylene bis(di-2,6-xylenyl phosphate), 9,10-dihydro-9-oxa-10-phosphaphenanthrene-10-oxide (DOPO), condensed phosphoric acid ester compounds such as aromatic condensed phosphoric acid ester compounds, and cyclic phosphoric acid ester compounds. Examples of the phosphorous acid ester compound include trimethyl phosphite and triethyl phosphite. Examples of the phosphine compound include tris-(4-methoxyphenyl)phosphine and triphenylphosphine. In addition, the compatible phosphorus compounds may be used singly or in combination of two or more thereof.

The non-compatible phosphorus compound is not particularly limited as long as it is a non-compatible phosphorus compound acting as a flame retardant and non-compatible with the mixture. Herein, the term "non-compatible" refers to a state where the object (phosphorus compound) is not compatible in the mixture of the thermosetting resin and the curing agent, and is dispersed like islands in the mixture. Examples of the non-compatible phosphorus compound include a compound containing phosphorus and forming a salt, such as a phosphinate compound, a polyphosphate compound, and a phosphonium salt compound, a phosphine oxide compound, and the like. Examples of the phosphinate compound include aluminum dialkylphosphinate, aluminum tris(diethylphosphinate), aluminum tris(methylethylphosphinate), aluminum trisdiphenylphosphinate, zinc bisdiethylphosphinate, zinc bismethylethylphosphinate, zinc bisdiphenylphosphinate, titanyl bisdiethylphosphinate, titanyl bismethylethylphosphinate, titanyl bisdiphenylphosphinate, and the like. Examples of the polyphosphate compound include melamine polyphosphate, melam polyphosphate, melem polyphosphate, and the like. Examples of the phosphonium salt compound include tetraphenylphosphonium tetraphenylborate, tetraphenylphosphonium bromide, and the like. Examples of the phosphine oxide compound include phosphine oxide compounds (diphenylphosphine oxide compounds) having two or more diphenylphosphine oxide groups in the molecule, and the like, and more specifically include paraxylylene bisdiphenylphosphine oxide, and the like. In addition, these non-compatible phosphorus compounds may be used singly or in combination of two or more thereof.

The present inventors have found that the interlayer adhesion of a cured product cannot be sometimes sufficiently enhanced by merely using the compatible phosphorus compound and the non-compatible phosphorus compound in combination.

Through investigation by the present inventors, this is considered as follows. First, in a metal-clad laminate including a resin composition in which the compatible phosphorus compound and the non-compatible phosphorus compound are used in combination, the compatible phosphorus compound (condensed phosphoric acid ester, etc.) oozes out to the surface of an insulating layer (core material) containing the resin composition. Then, the compatible phosphorus compound such as condensed phosphoric acid ester is hydrolyzed with the non-compatible phosphorus compound (phosphinate compound, etc.), so that the phosphoric acid ester produces, for example, an acidic phosphoric acid ester. Then, when a metal foil of the metal-clad laminate is removed by etching treatment in order to make the metal-clad laminate being multilayered, a copper foil serving as a metal foil is dissolved, whereby a copper foil treating agent such as a silane coupling agent remains on the core material. Then, the copper foil treating agent such as a silane coupling agent reacts with the acidic phosphoric acid ester. A product produced by this reaction acts like a release agent and reduces the adhesion with a prepreg and the like laminated on the core material for multilayer formation. From the above description, the present inventors have presumed that interlayer adhesion cannot be sometimes sufficiently enhanced by merely using the compatible phosphorus compound and the non-compatible phosphorus compound in combination. In addition, they have also found that when the content of the compatible phosphorus compound is too large, or the content of the non-compatible phosphorus compound is too large, chemical resistance of the cured product, such as alkali resistance, sometimes deteriorates.

From the above description, the present inventors have found that not only by simply using the compatible phosphorus compound and the non-compatible phosphorus compound but also by adjusting the content thereof, it is possible to improve the heat resistance, flame retardancy, and interlayer adhesion of the cured product.

Therefore, in the resin composition according to the present embodiment, the content of the compatible phosphorus compound is 1 to 3.5 parts by mass, preferably 1 to 3 parts by mass, more preferably 2 to 3 parts by mass, per 100 parts by mass of the total of the thermosetting resin and the curing agent. When the amount of the compatible phosphorus compound is too small, there is a tendency that the effect of improving the flame retardancy by using the compatible phosphorus compound and the non-compatible phosphorus compound in combination cannot be sufficiently exhibited. On the other hand, when the amount of the compatible phosphorus compound is too large, the interlayer adhesion tends to be lowered. Therefore, by containing the compatible phosphorus compound in the above amount, it is possible to enhance the interlayer adhesion while enhancing the flame retardancy.

The content of the non-compatible phosphorus compound is 14 to 30 parts by mass, preferably 14 to 25 parts by mass, more preferably 14 to 22 parts by mass, per 100 parts by mass of the total of the thermosetting resin and the curing agent. When the content of the non-compatible phosphorus compound is too small, there is a tendency that the effect of improving the flame retardancy by using the compatible phosphorus compound and the non-compatible phosphorus compound in combination cannot be sufficiently exhibited. On the other hand, when the content of the non-compatible phosphorus compound is too large, the total amount of the flame retardant becomes too large, so that there is a tendency that the dielectric properties and chemical resistance such as alkali resistance are deteriorated. Therefore, by containing the non-compatible phosphorus compound in the above amount, it is possible to sufficiently suppress the deterioration of chemical resistance and the like while enhancing the flame retardancy and maintaining excellent dielectric properties.

The content ratio of the compatible phosphorus compound and the non-compatible phosphorus compound is preferably 3:97 to 20:80 in mass ratio, more preferably 3:97 to 19:81, still more preferably 5:95 to 15:85, even still more preferably 5:95 to 13:87. With such a content ratio, a resin composition whose cured product is excellent in heat resistance, flame retardancy, and interlayer adhesion is obtained. In addition, the cured product of this resin composition is also excellent in chemical resistance such as alkali resistance. This is considered to be because the effect of using the compatible phosphorus compound and the non-compatible phosphorus compound in combination as flame retardant can be more sufficiently exerted while sufficiently suppressing reduction in interlayer adhesion and chemical resistance.

The resin composition according to the present embodiment may contain the flame retardant composed of the compatible phosphorus compound and the non-compatible phosphorus compound or may contain a flame retardant other than these two compounds. The flame retardant other than the compatible phosphorus compound and the non-compatible phosphorus compound may be contained, but it is preferable not to contain a halogen-based flame retardant from the viewpoint of halogen-free.

The resin composition according to the present embodiment may be composed of the thermosetting resin, the curing agent, and the flame retardant, but the resin composition may further contain other components as long as it contains these three substances. Examples of the other components include fillers, additives, and the like.

The resin composition according to the present embodiment may contain a filler such as an inorganic filler as described above. Examples of the filler include those added to enhance the heat resistance and flame retardancy of the cured product of the resin composition, and such fillers are not particularly limited. Further, by including the filler, the heat resistance and the flame retardancy can be further enhanced. Specific examples of the filler include silica such as spherical silica, metal oxides such as alumina, titanium oxide, and mica, metal hydroxides such as aluminum hydroxide and magnesium hydroxide, talc, aluminum borate, barium sulfate, calcium carbonate, and the like. Among them, the filler is preferably silica, mica, or talc, more preferably spherical silica. The fillers may be used singly or in combination of two or more thereof. The filler may be used as it is or may be used after being subjected to a surface treatment with an epoxysilane type or aminosilane type silane coupling agent. When the filler is contained, its content is preferably 10 to 200 parts by mass, more preferably 30 to 150 parts by mass per 100 parts by mass of the total of the flame retardant and an organic component excluding the flame retardant.

The resin composition according to the present embodiment may contain additives as described above. Examples of the additives include antifoaming agents such as silicone-based antifoaming agents and acrylic acid ester-based antifoaming agents, heat stabilizers, antistatic agents, ultraviolet absorbers, dyes, pigments, lubricants, wet dispersants, and the like.

The resin composition according to the present embodiment is a resin composition that provides a cured product excellent in heat resistance, flame retardancy, and interlayer adhesion. In addition, the cured product of this resin composition is also excellent in chemical resistance such as alkali resistance. Since this resin composition is excellent in interlayer adhesion and chemical resistance of the cured product, such a resin composition is a substrate material suitably adapted for multilayer formation and the like.

More specific embodiments in which the combinations of the thermosetting resin and the curing agent are different will be described below.

Embodiment 1

A resin composition according to Embodiment 1 contains, as the thermosetting resin, a modified polyphenylene ether compound that is terminal-modified with a substituent having a carbon-carbon unsaturated double bond, and, as the curing agent, a crosslinking curing agent having a carbon-carbon unsaturated double bond in the molecule. In other words, the resin composition according to Embodiment 1 contains a modified polyphenylene ether compound that is terminal-modified with a substituent having a carbon-carbon unsaturated double bond, a crosslinking curing agent having a carbon-carbon unsaturated double bond in the molecule, and a flame retardant.

The modified polyphenylene ether compound is not particularly limited as long as it is polyphenylene ether that is terminal-modified with a substituent having a carbon-carbon unsaturated double bond. The substituent having a carbon-carbon unsaturated double bond is not particularly limited. Examples of the substituent include substituents represented by the following general formula (1), and the like.

[Formula 1]

(1)

In the formula (1), n represents 0 to 10. Z represents an arylene group. $R^1$ to $R^3$ are independent from one another. That is, $R^1$ to $R^3$ may each be the same or different groups. $R^1$ to $R^3$ each represent a hydrogen atom or an alkyl group.

In the formula (1), when n is 0, Z is directly bonded to the terminal of the polyphenylene ether.

The arylene group is not particularly limited, and examples thereof include a monocyclic aromatic group such as a phenylene group, and a polycyclic aromatic group in which the aromatic moiety is not a monocyclic ring, but is a naphthalene ring. Other examples of the arylene group include derivatives in which the hydrogen atoms bonded to the aromatic ring are substituted with functional groups such as alkenyl groups, alkynyl groups, formyl groups, alkylcarbonyl groups, alkenylcarbonyl groups, or alkynylcarbonyl groups.

The alkyl group is not particularly limited, and is preferably an alkyl group having 1 to 18 carbon atoms, and more preferably an alkyl group having 1 to 10 carbon atoms. Specific examples of the alkyl group include a methyl group, an ethyl group, a propyl group, a hexyl group, and a decyl group.

Specific examples of the substituent include vinylbenzyl groups (ethenylbenzyl group) such as a p-ethenylbenzyl group and a m-ethenylbenzyl group, a vinylphenyl group, an acrylate group, and a methacrylate group.

Preferred specific examples of the substituent represented by the formula (1) include functional groups containing a vinylbenzyl group. Specific examples thereof include at least one substituent selected from the following formula (2) and formula (3), and the like.

[Formula 2]

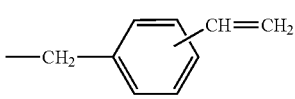

(2)

[Formula 3]

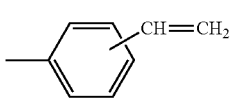

(3)

An example of another substituent having a carbon-carbon unsaturated double bond, which is terminal-modified in the modified polyphenylene ether, includes a (meth)acrylate group, and the (meth)acrylate group is represented by, for example, the following formula (4).

[Formula 4]

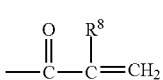

(4)

In the formula (4), $R^8$ represents a hydrogen atom or an alkyl group. The alkyl group is not particularly limited, and is preferably, for example, an alkyl group having 1 to 18 carbon atoms, more preferably an alkyl group having 1 to 10 carbon atoms. Specific examples thereof include a methyl group, an ethyl group, a propyl group, a hexyl group, a decyl group, and the like.

The modified polyphenylene ether has a polyphenylene ether chain in the molecule, and preferably has a repeating unit represented by the following formula (5) in the molecule.

[Formula 5]

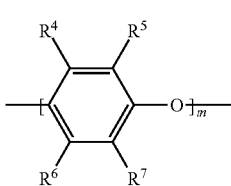

(5)

In the formula (5), m represents 1 to 50, and $R^4$ to $R^7$ are independent from one another. That is, R to $R^7$ may each be the same or different group. $R^4$ to $R^7$ each represent a hydrogen atom, an alkyl group, an alkenyl group, an alkynyl group, a formyl group, an alkylcarbonyl group, an alkenylcarbonyl group, or an alkynylcarbonyl group. Among them, each of $R^4$ to $R^7$ is preferably a hydrogen atom and an alkyl group.

Specific examples of each functional group listed in $R^4$ to $R^7$ include the following.

The alkyl group is not particularly limited, and is preferably an alkyl group having 1 to 18 carbon atoms, more preferably an alkyl group having 1 to 10 carbon atoms. Specific examples the alkyl group include a methyl group, an ethyl group, a propyl group, a hexyl group, a decyl group, and the like.

The alkenyl group is not particularly limited, and is preferably an alkenyl group having 2 to 18 carbon atoms, more preferably an alkenyl group having 2 to 10 carbon atoms. Specific examples of the alkenyl group include a vinyl group, an allyl group, a 3-butenyl group, and the like.

The alkynyl group is not particularly limited, and is preferably an alkynyl group having 2 to 18 carbon atoms, more preferably an alkynyl group having 2 to 10 carbon atoms. Specific examples of the alkynyl group include an ethynyl group, a prop-2-yn-1-yl group (a propargyl group), and the like.

The alkylcarbonyl group is not particularly limited as long as it is a carbonyl group substituted with an alkyl group, and is preferably an alkylcarbonyl group having 2 to 18 carbon atoms, more preferably an alkylcarbonyl group having 2 to 10 carbon atoms. Specific examples of the alkylcarbonyl group include an acetyl group, a propionyl group, a butyryl group, an isobutyryl group, a pivaloyl group, a hexanoyl group, an octanoyl group, a cyclohexylcarbonyl group, and the like.

The alkenylcarbonyl group is not particularly limited as long as it is a carbonyl group substituted with an alkenyl group, and is preferably an alkenylcarbonyl group having 3 to 18 carbon atoms, more preferably an alkenylcarbonyl group having 3 to 10 carbon atoms. Specific examples of the alkenylcarbonyl group include an acryloyl group, a methacryloyl group, a crotonoyl group, and the like.

The alkynylcarbonyl group is not particularly limited as long as it is a carbonyl group substituted with an alkynyl group, and is preferably an alkynylcarbonyl group having 3 to 18 carbon atoms, more preferably an alkynylcarbonyl group having 3 to 10 carbon atoms. Specific examples of the alkynylcarbonyl group include a propioloyl group and the like.

The weight average molecular weight (Mw) of the modified polyphenylene ether compound is not particularly limited. Specifically, the Mw is preferably 500 to 5000, more preferably 800 to 4000, and still more preferably 1000 to 3000. Here, the weight average molecular weight may be measured by a general molecular weight measurement method, and the weight average molecular weight is specifically a value measured by gel permeation chromatography (GPC) or the like. Also, when the modified polyphenylene ether compound has a repeating unit represented by the formula (5) in the molecule, m is preferably a numerical value such that the weight average molecular weight of the modified polyphenylene ether compound falls within the above range. Specifically, m is preferably 1 to 50.

When the weight average molecular weight of the modified polyphenylene ether compound is in the above range, the resin composition of Embodiment 1 has excellent dielectric properties possessed by the polyphenylene ether, and provides a cured product excellent in moldability as well as in heat resistance. The reason for this is considered to be following. A common polyphenylene ether has a comparatively low molecular weight when its Mw is in the above range. As a result, a cured product tends to have low heat resistance. In this respect, since the modified polyphenylene ether compound has an unsaturated double bond at its terminal, it is thought that a cured product having sufficiently high heat resistance can be obtained. Furthermore, when the weight average molecular weight of the modified polyphenylene ether compound is in the above range, the modified polyphenylene ether compound is considered to have a comparatively low molecular weight, so that the cured product is excellent in moldability. Therefore, it is considered that such a modified polyphenylene ether compound gives a cured product excellent in not only heat resistance but also moldability.

The average number of the substituents at the molecular terminal (the number of terminal functional groups) per molecule of modified polyphenylene ether in the modified polyphenylene ether compound is not particularly limited. Specifically, the average number is preferably 1 to 5, more preferably 1 to 3, still more preferably 1.5 to 3. When the number of terminal functional groups is too small, the cured product tends to have insufficient heat resistance. On the other hand, when the number of terminal functional groups is too large, the reactivity becomes too high, so that disadvantages such as decrease in storage stability or fluidity of the resin composition may arise. Thus, when such modified polyphenylene ether with insufficient fluidity is used, for example, molding defects such as generation of voids due to insufficient fluidity or the like at the time of multilayer molding occurred, and a molding problem such that it is difficult to obtain a highly reliable printed wiring board may occur.

The number of terminal functional groups of the modified polyphenylene ether compound is a numerical value representing an average value of the substituents per molecule of all the modified polyphenylene ether compounds present in 1 mole of the modified polyphenylene ether compound. The number of terminal functional groups can be determined by, for example, measuring the number of hydroxyl groups remaining in the obtained modified polyphenylene ether compound and then calculating the decrease from the number of hydroxyl groups of the polyphenylene ether before modification. The decrease from the number of hydroxy groups of the polyphenylene ether before modification is the number of terminal functional groups. The number of hydroxyl groups remaining in the modified polyphenylene ether compound can be determined by adding a quaternary ammonium salt (tetraethylammonium hydroxide), which is associated with a hydroxyl group, to a solution of the modified polyphenylene ether compound, and measuring the UV absorbance of the mixed solution.

The intrinsic viscosity of the modified polyphenylene ether compound is not particularly limited. Specifically, the intrinsic viscosity is preferably 0.03 to 0.12 dl/g, more preferably 0.04 to 0.11 dl/g, still more preferably 0.06 to 0.095 dl/g. When the intrinsic viscosity is too low, the molecular weight tends to be low, making it unlikely to obtain low dielectric properties such as a low dielectric constant and a low dielectric loss tangent. On the other hand, when the intrinsic viscosity is too high, the viscosity tends to be high, resulting in failure to obtain a sufficient fluidity of the modified polyphenylene ether compound. Thus, the moldability of the cured product tends to decrease. Therefore, when the modified polyphenylene ether compound has an intrinsic viscosity in the above range, excellent heat resistance and moldability of the cured product can be realized.

The intrinsic viscosity herein mentioned is measured in a methylene chloride at 25° C. More specifically, the intrinsic viscosity is measured, for example, in 0.18 g/45 ml of methylene chloride solution (solution temperature: 25° C.) using a viscometer. Examples of the viscometer include Visco System AVS 500 available from Schott.

The method of synthesizing the modified polyphenylene ether compound is not particularly limited as long as a modified polyphenylene ether compound, which is terminal-modified with a substituent having a carbon-carbon unsaturated double bond, can be synthesized. Specific examples thereof include a method where a polyphenylene ether is caused to react with a compound to which a halogen atom and a substituent having a carbon-carbon unsaturated double bond are bonded, and the like.

Examples of the compound to which a halogen atom and a substituent having a carbon-carbon unsaturated double bond are bonded include a compound represented by the formula (6) below, and the like.

[Formula 6]

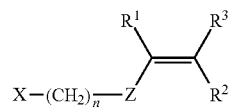

(6)

In the formula (6), n, Z, and $R^1$ to $R^3$ are identical to those in the formula (1). Specifically, n represents 0 to 10. Z represents an arylene group. $R^1$ to $R^3$ are independent from one another. That is, $R^1$ to $R^3$ may each be the same or different groups. $R^1$ to $R^3$ each represent a hydrogen atom or an alkyl group. X represents a halogen atom, and specifically represents a chlorine atom, a bromine atom, an iodine atom, or a fluorine atom. Among them, a chlorine atom is preferable.

As the compound represented by the formula (6), those exemplified above may be used singly or in combination of two or more thereof.

Examples of the compound to which a halogen atom and a substituent having a carbon-carbon unsaturated double bond are bonded include p-chloromethylstyrene, m-chloromethylstyrene, and the like.

A polyphenylene ether as a raw material is not particularly limited as long as it can finally synthesize a predetermined modified polyphenylene ether compound. Specific examples thereof include those containing polyphenylene ether as a main component, such as a polyphenylene ether composed of 2,6-dimethylphenol and at least one of a bifunctional phenol and a trifunctional phenol, and poly(2,6-dimethyl-1,4-phenylene oxide). Further, the bifunctional phenol is a phenol compound having two phenolic hydroxyl groups in the molecule, and examples thereof include tetramethyl bisphenol A and the like. The trifunctional phenol is a phenol compound having three phenolic hydroxyl groups in the molecule. More specific examples of the polyphenylene ether include polyphenylene ethers having a structure represented by the formula (7) or (8), and the like.

[Formula 7]

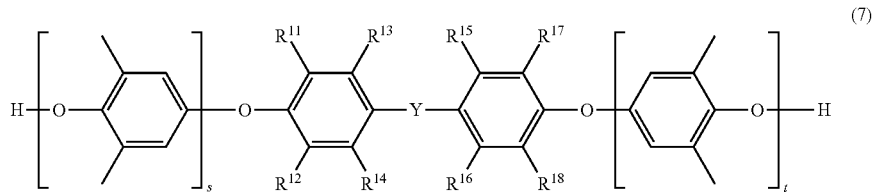

In the formula (7), s and t are preferably such that the sum of s and t is, for example, 1 to 30. Also, s is preferably 0 to 20, and t is preferably 0 to 20. That is, it is preferable that s represents 0 to 20, t represents 0 to 20, and the sum of s and t represents 1 to 30. $R^{11}$ to $R^{18}$ are independent from one another. That is, $R^{11}$ to $R^{18}$ may each be the same or different groups. $R^{11}$ to $R^{18}$ each represent a hydrogen atom or an alkyl group. The alkyl group is not particularly limited, and, for example, an alkyl group having 1 to 18 carbon atoms is preferable, and an alkyl group having 1 to 10 carbon atoms is more preferable. Specific examples of the alkyl group include a methyl group, an ethyl group, a propyl group, a hexyl group, a decyl group, and the like. Y represents a linear, branched or cyclic hydrocarbon group. Also, Y represents, for example, a group represented by the following formula (8).

[Formula 8]

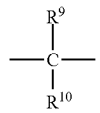

In the formula (8), $R^9$ and $R^{10}$ each independently represent a hydrogen atom or an alkyl group. Examples of the alkyl group include a methyl group and the like. Examples of the group represented by the formula (8) include a methylene group, a methylmethylene group, a dimethylmethylene group, and the like.

[Formula 9]

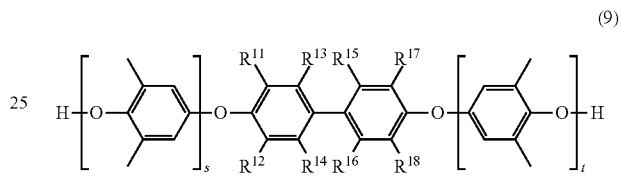

In the formula (9), s and t are the same as s and t defined in the formula (7). In the formula (9), $R^{11}$ to $R^{18}$ are the same as $R^{11}$ to $R^{18}$ defined in the formula (7).

More specific examples of the polyphenylene ether include a polyphenylene ether having a structure represented by the formulas (10) to (13), and the like.

[Formula 10]

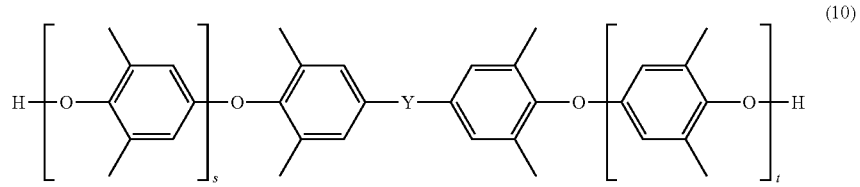

In the formula (10), s and t are the same as s and t defined in the formula (7), and Y is the same as Y defined in the formula (7).

[Formula 11]

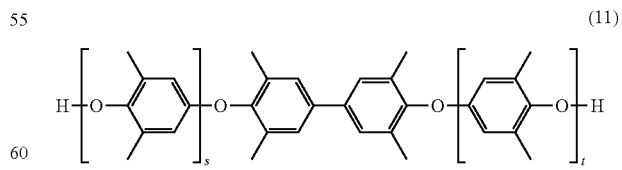

In the formula (11), s and t are the same as s and t defined in the formula (7).

[Formula 12]

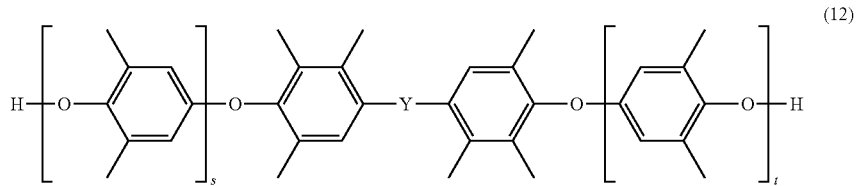

(12)

In the formula (12), s and t are the same as s and t defined in the formula (7).

[Formula 13]

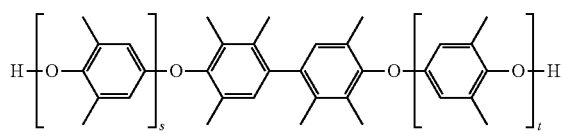

(13)

In the formula (13), s and t are the same as s and t defined in the formula (7).

The modified polyphenylene ether compound is preferably one that is obtained by terminal-modifying a polyphenylene ether having a structure represented by the formula (7) or (9) with a substituent having a carbon-carbon unsaturated double bond as described above. Examples of the modified polyphenylene ether compound include those having a group represented by the formula (1) or (4) at the terminal of the polyphenylene ether represented by the formula (7) or (9). More specific examples thereof include modified polyphenylene ethers represented by the following formulas (14) to (17).

[Formula 14]

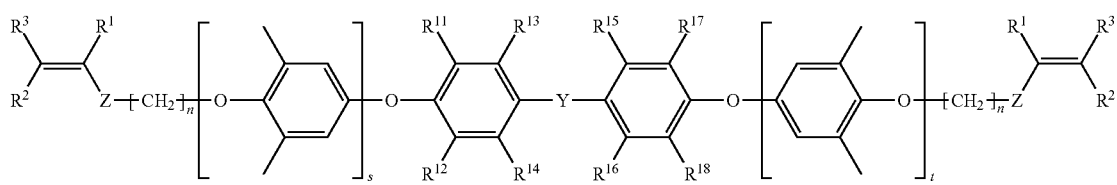

(14)

In the formula (14), s and t are the same as s and t defined in the formula (7), and Y is the same as Y defined in the formula (7). In the formula (14), $R^1$ to $R^3$ are the same as $R^1$ to $R^3$ defined in the formula (1); Z is the same as Z defined in the formula (1); and n is the same as n defined in the formula (1). In the formula (14), $R^{11}$ to $R^{18}$ are the same as $R^{11}$ to $R^{18}$ defined in the formula (7).

[Formula 15]

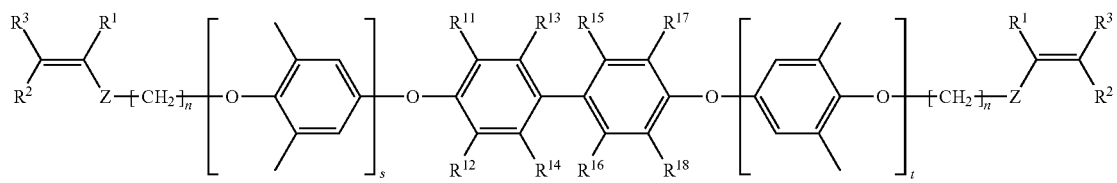

(15)

In the formula (15), s and t are the same as s and t defined in the formula (7). In the formula (15), $R^1$ to $R^3$ are the same as $R^1$ to $R^3$ defined in the formula (1), Z is the same as Z defined in the formula (1), and n is the same as n defined in the formula (1). In the formula (15), $R^{11}$ to $R^{18}$ are the same as $R^{11}$ to $R^{18}$ defined in the formula (7).

[Formula 16]

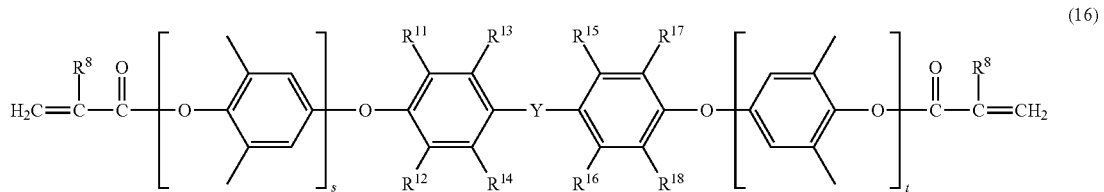

(16)

In the formula (16), s and t are the same as s and t defined in the formula (7) and Y is the same as Y defined in the formula (7). In the formula (16), $R^8$ is the same as $R^8$ defined in the formula (4). In the formula (16), $R^{11}$ to $R^{18}$ are the same as $R^{11}$ to $R^{18}$ defined in the formula (7).

[Formula 17]

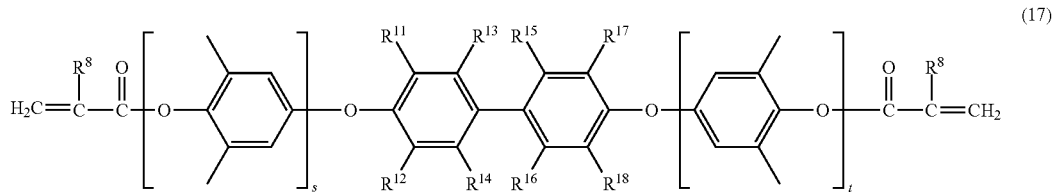

(17)

In the formula (17), s and t are the same as s and t defined in the formula (7). In the formula (17), $R^8$ is the same as $R^8$ defined in the formula (4). In the formula (17), $R^{11}$ to $R^{18}$ are the same as $R^{11}$ to $R^{18}$ defined in the formula (7).

More specific examples of the modified polyphenylene ether compound include a modified polyphenylene ether compound having a structure represented by the formulas (18) to (24), and the like.

[Formula 18]

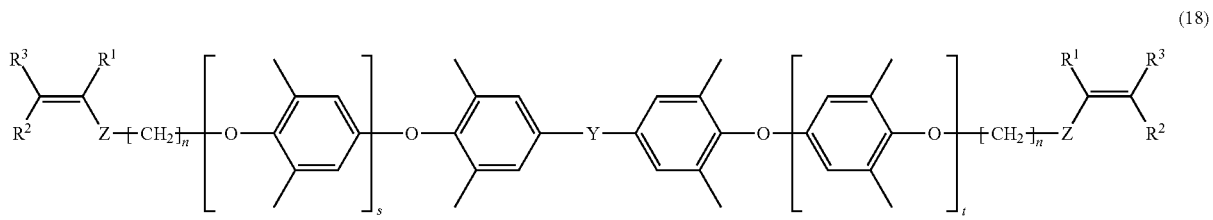

(18)

In the formula (18), s and t are the same as s and t defined in the formula (7), and Y is the same as Y defined in the formula (7). In the formula (18), $R^1$ to $R^3$ are the same as $R^1$ to R defined in the formula (1), Z is the same as Z defined in the formula (1), and n is the same as n defined in the formula (1).

[Formula 19]

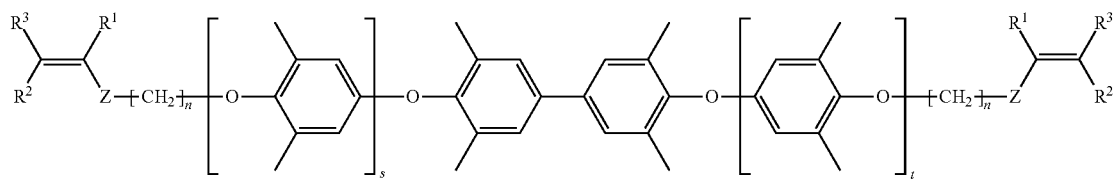
(19)

In the formula (19), s and t are the same as s and t defined in the formula (7). In the formula (19), $R^1$ to $R^3$ are the same as $R^1$ to $R^3$ defined in the formula (I), Z is the same as Z defined in the formula (1), and n is the same as n defined in the formula (1).

[Formula 20]

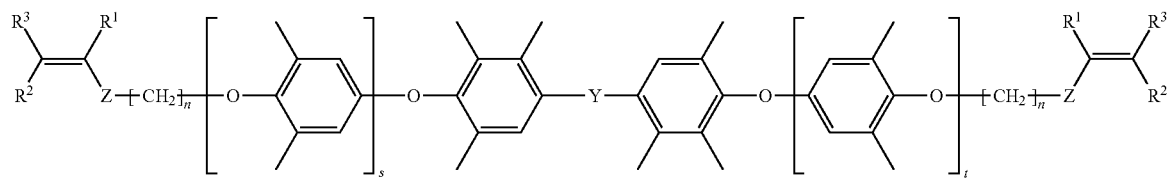
(20)

In the formula (20), s and t are the same as s and t defined in the formula (7), and Y is the same as Y defined in the formula (7). In the formula (20), $R^1$ to $R^3$ are the same as $R^1$ to $R^3$ defined in the formula (1), Z is the same as Z defined in the formula (1), and n is the same as n defined in the formula (1).

[Formula 21]

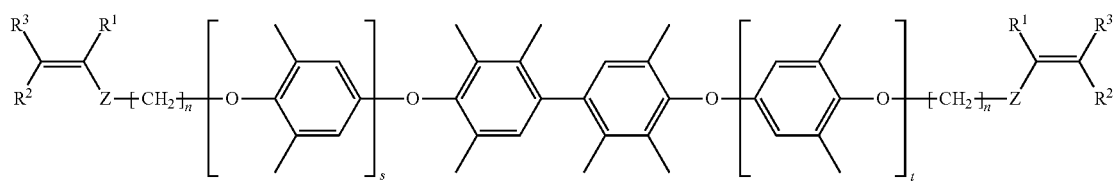
(21)

In the formula (21), s and t are the same as s and t defined in the formula (7). In the formula (21), $R^1$ to $R^3$ are the same as $R^1$ to $R^3$ defined in the formula (1), Z is the same as Z defined in the formula (1), and n is the same as n defined in the formula (1).

[Formula 22]

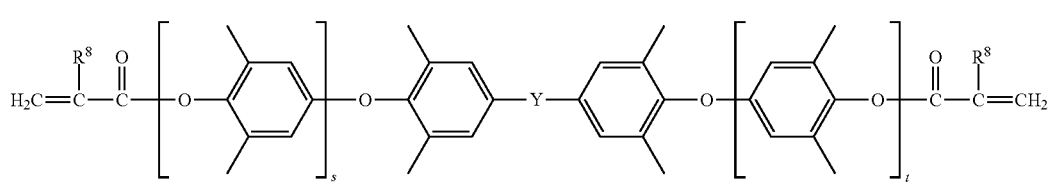
(22)

In the formula (22), s and t are the same as s and t defined in the formula (7), and Y is the same as Y defined in the formula (7). In the formula (22), $R^8$ is the same as $R^8$ defined in the formula (4).

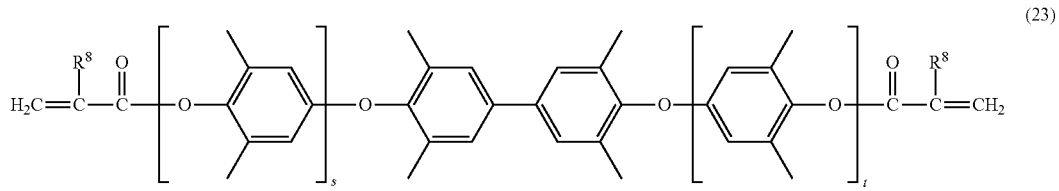

In the formula (23), s and t are the same as s and t defined in the formula (7). In the formula (23), $R^8$ is the same as $R^8$ defined in the formula (4).

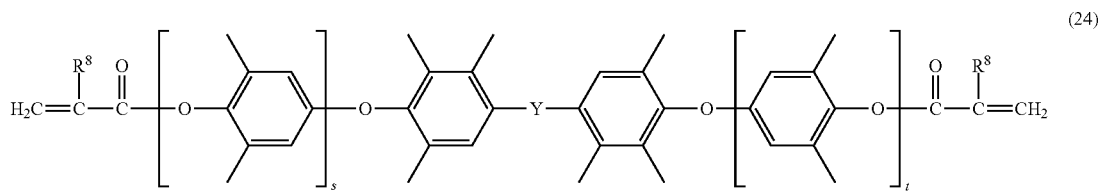

In the formula (24), s and t are the same as s and t defined in the formula (7), and Y is the same as Y defined in the formula (7). In the formula (24), $R^8$ is the same as $R^8$ defined in the formula (4).

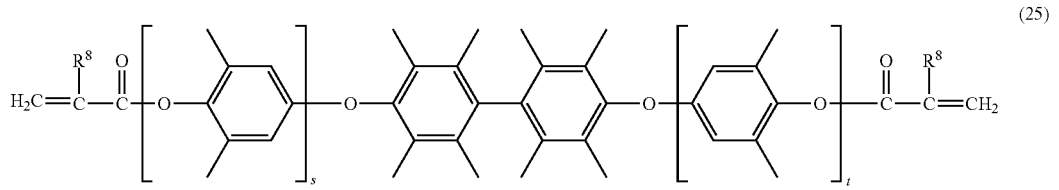

In the formula (25), s and t are the same as s and t defined in the formula (7). In the formula (25), $R^8$ is the same as $R^8$ defined in the formula (4).

As a method of synthesizing the modified polyphenylene ether compound, the above-described method can be mentioned. Specifically, the polyphenylene ether as described above and the compound represented by the formula (6) are dissolved in a solvent and then stirred. By doing so, the polyphenylene ether reacts with the compound represented by the formula (6) to obtain the modified polyphenylene ether compound.

In the reaction, it is preferable to carry out the reaction in the presence of an alkali metal hydroxide. By doing so, this reaction is considered to proceed favorably. This is considered to be due to the fact that the alkali metal hydroxide functions as a dehydrohalogenating agent, specifically as a dehydrochlorinating agent. That is, the alkali metal hydroxide eliminates the hydrogen halide from the phenol group of the polyphenylene ether and the compound represented by the formula (6), so that the substituent represented by the formula (1) is considered to be bonded to the oxygen atom of the phenol group in place of the hydrogen atom of the phenol group of the polyphenylene ether.

The alkali metal hydroxide is not particularly limited as long as it can function as a dehalogenating agent, and examples thereof include sodium hydroxide and the like. The alkali metal hydroxide is usually used in the form of an aqueous solution, specifically, in the form of an aqueous solution of sodium hydroxide.

The reaction conditions such as the reaction time and the reaction temperature in the reaction described above vary depending on the compound represented by the formula (6) and the like, and are not particularly limited as long as the reaction proceeds favorably. Specifically, the reaction temperature is preferably room temperature to 100° C., more preferably 30 to 100° C. The reaction time is preferably 0.5 to 20 hours, more preferably 0.5 to 10 hours.

The solvent used at the time of the reaction is not particularly limited as long as it can dissolve the polyphenylene ether and the compound represented by the formula (6) and does not inhibit the reaction between the polyphenylene ether and the compound represented by the formula (6). Specific examples of the solvent include toluene and the like.

The reaction described above is preferably performed in the presence of not only an alkali metal hydroxide but also a phase-transfer catalyst. In other words, it is preferable to perform the reaction in the presence of an alkali metal hydroxide and a phase-transfer catalyst. By doing so, the reaction is considered to proceed more favorably. This is considered to be following. Such favorable reaction is considered to be due to that the phase-transfer catalyst, which has a function of incorporating an alkali metal hydroxide, is soluble both in the polar solvent phase such as water and in the nonpolar solvent phase such as an organic solvent, and is a catalyst capable of moving between these phases. Specifically, in the case where an aqueous solution of sodium hydroxide is used as the alkali metal hydroxide, and an organic solvent such as toluene, which is incompatible with water, is used as the solvent, even if the aqueous solution of sodium hydroxide is added dropwise to the solvent used in the reaction, it is considered that the solvent and the aqueous solution of sodium hydroxide are separated, so that sodium hydroxide is difficult to transfer to the solvent. Consequently, it is considered that the aqueous solution of sodium hydroxide added as the alkali metal hydroxide does not sufficiently contribute to promotion of the reaction. In contrast, when the reaction is carried out in the presence of an alkali metal hydroxide and a phase-transfer catalyst, the alkali metal hydroxide is transferred to the solvent in a state where the alkali metal hydroxide is incorporated in the phase-transfer catalyst, and thus the aqueous solution of sodium hydroxide is considered to be likely to contribute to promotion of the reaction. For this reason, this is considered that the reaction proceeds favorably in the presence of the alkali metal hydroxide and the phase-transfer catalyst.

The phase-transfer catalyst is not particularly limited, and examples thereof include a quaternary ammonium salt such as tetra-n-butylammonium bromide and the like.

It is preferable that the resin composition contains the modified polyphenylene ether compound obtained as described above as a modified polyphenylene ether.

The crosslinking curing agent used in Embodiment 1 is not particularly limited as long as it has a carbon-carbon unsaturated double bond in the molecule. That is, the crosslinking curing agent may be one that is capable of forming cross-linkages through the reaction with the modified polyphenylene ether compound and then curing the crosslinked product. The crosslinking curing agent is preferably a compound having two or more carbon-carbon unsaturated double bonds in the molecule.

The weight average molecular weight of the crosslinking curing agent is preferably 100 to 5000, more preferably 100 to 4000, still more preferably 100 to 3000. When the weight average molecular weight of the crosslinking curing agent is too low, the crosslinking curing agent may be liable to be volatilized from the compounding component system of the resin composition. When the weight average molecular weight of the crosslinking curing agent is too high, the viscosity of the varnish of the resin composition and the melt viscosity during heat molding may become too high. Therefore, when the weight average molecular weight of the crosslinking curing agent is within the above range, a resin composition whose cured product is excellent in heat resistance can be obtained. This is considered to be because cross-linkages can be suitably formed by the reaction with the modified polyphenylene ether compound. Here, the weight average molecular weight may be measured by a general molecular weight measurement method, and the weight average molecular weight is specifically a value measured by gel permeation chromatography (GPC) or the like.

The average number of the carbon-carbon unsaturated double bonds per molecule (the number of terminal double bonds) of the crosslinking curing agent differs depending on the weight average molecular weight of the crosslinking curing agent, but is preferably 1 to 20, more preferably 2 to 18. When the number of terminal double bonds is too small, a cured product tends to have insufficient heat resistance. On the other hand, when the number of terminal double bonds is too large, the reactivity becomes too high, so that disadvantages such as decrease in storage stability or fluidity of the resin composition may arise.

In further consideration of the weight average molecular weight of the crosslinking curing agent, when the weight average molecular weight of the crosslinking curing agent is less than 500 (for example, 100 or more and less than 500), the number of terminal double bonds in the crosslinking curing agent is preferably 1 to 4. When the weight average molecular weight is 500 or more (for example, 500 or more and 5000 or less), the number of terminal double bonds in the crosslinking curing agent is preferably 3 to 20. In the respective cases, when the number of terminal double bonds is smaller than the lower limit of the above range, the crosslinking curing agent may have low reactivity, and the cured product of the resin composition has a low crosslinking density, so that the heat resistance and the glass transition point (Tg) may be insufficient. On the other hand, when the number of terminal double bonds is larger than the upper limit of the above range, the resin composition may be liable to form a gel.

The number of terminal double bonds herein can be found from the standard value of the product of the crosslinking curing agent to be used. Specifically, the number of terminal double bonds herein is, for example, a numerical value representing the average value of the number of double bonds per molecule of all the crosslinking curing agents present in 1 mole of the crosslinking curing agent.

Specific examples of the crosslinking curing agent include the following: trialkenyl isocyanurate compounds such as triaryl isocyanurates (TAIC); polyfunctional methacrylate compounds having two or more methacrylic groups in the molecule; polyfunctional acrylate compounds having two or more acrylic groups in the molecule; vinyl compounds (polyfunctional vinyl compounds) having two or more vinyl groups in the molecule, such as polybutadienes; and vinylbenzyl compounds having a vinylbenzyl group in the molecule, such as styrene and divinylbenzene. Among them, those having two or more carbon-carbon double bonds in the molecule are preferable. Specific examples include trialkenyl isocyanurate compounds, polyfunctional acrylate compounds, polyfunctional methacrylate compounds, polyfunctional vinyl compounds, divinylbenzene compounds, and the like. When these are used, it is considered that cross-linkages are more suitably formed by the curing reaction, and the heat resistance of the cured product of the resin composition can be further enhanced. As the crosslinking curing agent, the exemplified crosslinking curing agents may be used singly or in combination of two or more thereof. As the crosslinking curing agent, a compound having two or more carbon-carbon unsaturated double bonds in the molecule and a compound having one carbon-carbon unsaturated double bond in the molecule may be used in combination. Specific examples of the compound having one carbon-carbon unsaturated double bond in the molecule include a compound (monovinyl compound) having one vinyl group in the molecule, and the like.

The content of the modified polyphenylene ether compound is preferably 30 to 90 parts by mass, more preferably 50 to 90 parts by mass, per 100 parts by mass of the total of the modified polyphenylene ether compound and the crosslinking curing agent. The content of the crosslinking curing agent is preferably 10 to 70 parts by mass, more preferably 10 to 50 parts by mass, per 100 parts by mass of the total of the modified polyphenylene ether compound and the crosslinking curing agent. That is, the content ratio of the modified polyphenylene ether compound and the crosslinking curing agent is preferably 90:10 to 30:70, more preferably 90:10 to 50:50. When the content of each of the modified polyphenylene ether compound and the crosslinking curing agent satisfies the above ratio, it is possible to obtain a resin composition whose cured product is excellent in heat resistance and flame retardancy. This is considered to be due to the favorable progress of the curing reaction between the modified polyphenylene ether compound and the crosslinking curing agent.

The flame retardant used in Embodiment 1 contains a compatible phosphorus compound that is compatible with a mixture of the modified polyphenylene ether compound and the crosslinking curing agent and a non-compatible phosphorus compound that is not compatible with the mixture.

The compatible phosphorus compound is not particularly limited as long as it is a phosphorus compound acting as a flame retardant and compatible with the mixture. Here, the term "compatible" refers to a state where the phosphorus compound is finely dispersed, for example, at a molecular level in the mixture of the modified polyphenylene ether compound and the crosslinking curing agent. Specific examples of the compatible phosphorus compound are as described above. Among them, a phosphazene compound is preferable as the compatible phosphorus compound.

The non-compatible phosphorus compound is not particularly limited as long as it is a non-compatible phosphorus compound acting as a flame retardant and not compatible with the mixture. Here, the term "non-compatible" refers to a state where the object (phosphorus compound) is not compatible in the mixture of the modified polyphenylene ether compound and the crosslinking curing agent, and is dispersed like islands in the mixture. Specific examples of the non-compatible phosphorus compound are as described above. Among them, a phosphinate compound is preferable as the non-compatible phosphorus compound.

The present inventors have found that the interlayer adhesion of the cured product cannot be sometimes sufficiently enhanced by merely using the compatible phosphorus compound and the non-compatible phosphorus compound in combination, as described above, that is, have found that the interlayer adhesion of the cured product cannot be sometimes sufficiently enhanced while maintaining excellent dielectric properties of the polyphenylene ether. Then, from the investigation by the present inventors, they have found that it is possible to enhance the flame retardancy, interlayer adhesion, and chemical resistance of the cured product, while maintaining excellent dielectric properties possessed by the polyphenylene ether, not only by merely using the compatible phosphorus compound and the non-compatible phosphorus compound in combination but also by adjusting these contents.

The resin composition according to Embodiment 1 may be composed of the modified polyphenylene ether compound, the thermosetting curing agent and the flame retardant, but as long as the resin composition contains these components, the composition may further contain other components. Examples of the other components include fillers, additives, reaction initiators, and the like.

The resin composition according to Embodiment 1 may contain a reaction initiator as described above. Even if the polyphenylene ether resin composition is composed of a modified polyphenylene ether compound and a thermosetting curing agent, the curing reaction may proceed. Even if the resin composition contains only the modified polyphenylene ether, the curing reaction may proceed. However, depending on process conditions, it may be difficult to increase the temperature until curing proceeds, so that a reaction initiator may be added. The reaction initiator is not particularly limited as long as it can promote the curing reaction between the modified polyphenylene ether and the thermosetting curing agent. Specific examples thereof include oxidants such as α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. Further, if necessary, a carboxylic acid metal salt or the like can be used in combination. By doing so, the curing reaction can be further promoted. Among them, α,α'-bis(t-butylperoxy-m-isopropyl)benzene is preferably used. Since α,α'-bis(t-butylperoxy-m-isopropyl)benzene has a relatively high reaction initiation temperature, it is possible to suppress the promotion of the curing reaction at the time when it is not necessary to perform the curing, such as during drying of prepreg, as well as to suppress the deterioration of the storage stability of the polyphenylene ether resin composition. In addition, since α,α'-bis(t-butylperoxy-m-isopropyl)benzene has low volatility, it is not volatilized during drying or preservation of prepreg and has good stability. Further, the reaction initiators may be used singly or in combination of two or more of thereof.

Specific examples of the fillers and additives mentioned as the other components are as described above.

The resin composition according to Embodiment 1 is a resin composition that can provide a cured product excellent in flame retardancy and interlayer adhesion while maintaining excellent dielectric properties of polyphenylene ether. In addition, the cured product of this resin composition is also excellent in chemical resistance such as alkali resistance. Since this resin composition provides a cured product excellent in interlayer adhesion and chemical resistance, it is a substrate material suitably adapted for multilayer formation and the like.

Embodiment 2

A resin composition according to Embodiment 2 contains, as the thermosetting resin, a polyphenylene ether compound, an epoxy compound, and a cyanate ester compound as the curing agent. That is, the resin composition according to Embodiment 2 contains a polyphenylene ether compound, an epoxy compound, a cyanate ester compound, and a flame retardant.

The polyphenylene ether compound is not particularly limited, and examples thereof include those containing polyphenylene ether as a main component, such as a polyphenylene ether composed of 2,6-dimethylphenol and at least one of a bifunctional phenol and a trifunctional phenol, and poly(2,6-dimethyl-1,4-phenylene oxide). More specifically, for example, a compound having a structure represented by the general formula (26) or (28) is preferable as the polyphenylene ether compound.

[Formula 26]

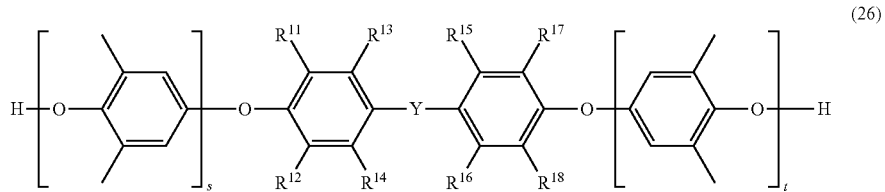

In the formula (26), s and t preferably have a total value of s and t of 1 to 30, for example. Also, s is preferably 0 to 20, and t is preferably 0 to 20. That is, it is preferable that s represents 0 to 20, t represents 0 to 20, and the sum of s and t represents 1 to 30. $R^{11}$ to $R^{18}$ are independent from one another. That is, $R^{11}$ to $R^{18}$ may each be the same or different groups. $R^{11}$ to $R^{18}$ each represent a hydrogen atom or an alkyl group. The alkyl group is not particularly limited, and, for example, an alkyl group having 1 to 18 carbon atoms is preferable, and an alkyl group having 1 to 10 carbon atoms is more preferable. Specific examples thereof include a methyl group, an ethyl group, a propyl group, a hexyl group, a decyl group, and the like. Y represents a linear, branched, or cyclic hydrocarbon group. Further, Y represents, for example, a group represented by the following formula (27).

[Formula 27]

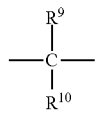

In the formula (27), $R^9$ and $R^{10}$ each independently represent a hydrogen atom or an alkyl group. Examples of the alkyl group include a methyl group and the like. Examples of the group represented by the formula (27) include a methylene group, a methylmethylene group, a dimethylmethylene group, and the like.

[Formula 28]

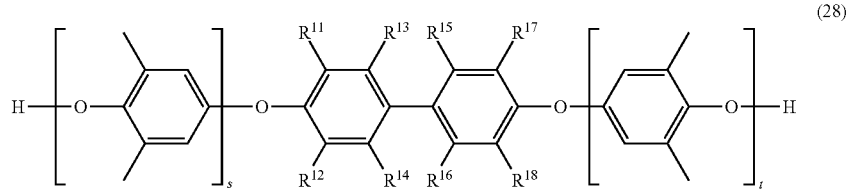

In the formula (28), s and t are the same as s and t defined in the formula (26). In the formula (28), $R^{11}$ to $R^{18}$ are the same as $R^{11}$ to $R^{18}$ defined in the formula (26).

More specific examples of the polyphenylene ether include a polyphenylene ether having a structure represented by the formulas (29) to (32), and the like.

[Formula 29]

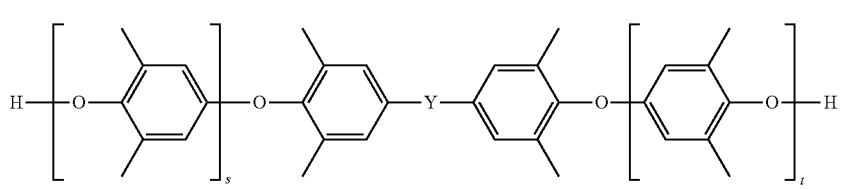

In the formula (29), s and t are the same as s and t defined in the formula (26), and Y is the same as Y defined in the formula (26).

[Formula 30]

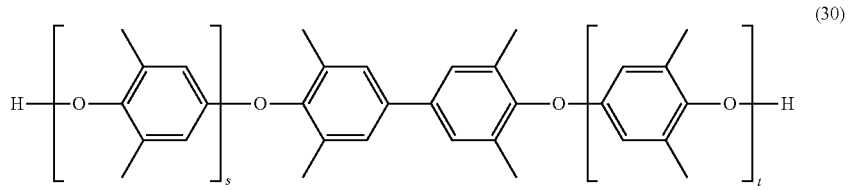

In the formula (30), s and t are the same as s and t defined in the formula (26).

[Formula 31]

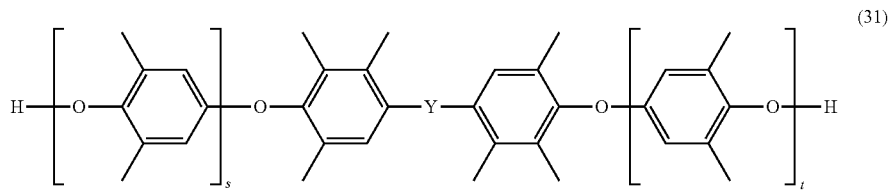

In the formula (31), s and t are the same as s and t defined in the formula (26).

[Formula 32]

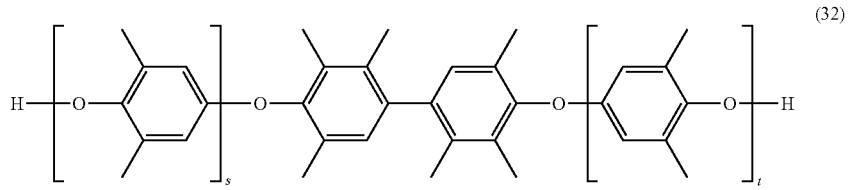

In the formula (32), s and t are the same as s and t defined in the formula (26).

The weight average molecular weight (Mw) of the polyphenylene ether compound is preferably from 500 to 5,000, preferably from 500 to 3,000. When the molecular weight is too low, a cured product having sufficient heat resistance tends not to be obtained. On the other hand, when the molecular weight is too high, the melt viscosity of the resin composition becomes higher, sufficient fluidity cannot be obtained, and molding defects tend not to be sufficiently suppressed. Therefore, when the weight average molecular weight of the polyphenylene ether compound is within the above range, excellent heat resistance and moldability of the cured product can be realized.

The weight average molecular weight herein can be specifically measured, for example, by gel permeation chromatography or the like.

As to the polyphenylene ether compound, the average number (the number of terminal hydroxyl groups) per molecule of phenolic hydroxyl groups at the molecular terminal is preferably 1 to 5, and more preferably 1.5 to 3. When the number of terminal hydroxyl groups is too small, the reactivity with an epoxy group of the epoxy resin decreases, and a cured product having sufficient heat resistance tends not to be obtained. On the other hand, when the number of terminal hydroxyl groups is too large, the reactivity with an epoxy group of the epoxy resin becomes too high, for example, so that disadvantages such as decrease in storage stability of the resin composition or increase in dielectric constant and dielectric loss tangent may arise.

The number of terminal hydroxyl groups of the polyphenylene ether compound herein can be found, for example, from the standard value of the product of the polyphenylene ether compound to be used. Specifically, the number of terminal hydroxyl groups of the polyphenylene ether compound herein is, for example, a numerical value representing the average value of hydroxyl groups per molecule of all the polyphenylene ether compounds present in 1 mole of the polyphenylene ether compound.

Since the polyphenylene ether compound having the weight average molecular weight and the number of terminal hydroxyl groups within the respective ranges have a relatively low molecular weight and a relatively large number of terminal hydroxyl groups, it is considered that three-dimensional crosslinking with the epoxy resin is easily formed. Therefore, it is considered that use of such a polyphenylene ether compound provides a resin composition having not only excellent dielectric properties in a wide frequency region, but also sufficient fluidity to reduce molding defects. The polyphenylene ether compound sufficiently enhances the heat resistance of the cured product.

The polyphenylene ether compound may contain a reaction product obtained by previously reacting at least a part of hydroxyl groups of the polyphenylene ether with the epoxy compound. That is, when such a reaction product is contained, the resin composition contains the polyphenylene ether, the epoxy compound, a reaction product obtained by previously reacting at least a part of hydroxyl groups of the polyphenylene ether with an epoxy group of the epoxy compound, a cyanate ester compound, and a flame retardant. In the resin composition, the flame retardant contains a compatible phosphorus compound that is compatible with a mixture of the reaction product and the cyanate ester compound, and a non-compatible phosphorus compound that is not compatible with the mixture. The epoxy compound used for obtaining the reaction product may be one that can form a suitable resin composition by reacting at least a part of hydroxyl groups of the polyphenylene ether with an epoxy group. Specifically, among the epoxy compounds described below, epoxy compounds having an average number of epoxy groups of 2 to 2.3 per molecule (average number of epoxy groups) and the like are exemplified.

The reaction product is not particularly limited as long as it is a product obtained by previously reacting (pre-reaction) at least a part of hydroxyl groups of the polyphenylene ether with an epoxy group of the epoxy compound. Specific examples of the reaction product include those obtained by reacting an epoxy group of the epoxy compound with ½ or more of the whole hydroxyl groups of the polyphenylene ether before reacting with the epoxy compound. More specifically, the reaction product can be obtained, for example, by the reaction as follows. First, the polyphenylene ether and the epoxy compound are stirred and mixed in an organic solvent for 10 to 60 minutes so that the polyphenylene ether and the epoxy compound have a predetermined ratio. In this case, it is preferable that the ratio of the polyphenylene ether and the epoxy compound is, for example, such that the equivalent ratio between a hydroxyl group of the polyphenylene ether and an epoxy group of the epoxy compound is preferably an equivalent ratio capable of providing the reaction product as described above. Then, after mixing the polyphenylene ether and the epoxy compound, the mixture is heated at 80 to 110° C. for 2 to 12 hours, so that the polyphenylene ether and the epoxy compound are reacted with each other. By doing so, the reaction product is obtained. Note that the organic solvent is not particularly limited as long as it dissolves the polyphenylene ether and the epoxy compound and does not inhibit the reaction. Specific examples of the organic solvent include toluene and the like.

When the polyphenylene ether is reacted with the epoxy compound, a catalyst may be mixed with the mixture of the polyphenylene ether and the epoxy compound. The catalyst can be used without particular limitation as long as it can promote the reaction between a hydroxyl group of the polyphenylene ether and an epoxy group of the epoxy compound. Specific examples of the catalyst include organometallic salts of organic acids such as octanoic acid, stearic acid, acetylacetonate, naphthenic acid, and salicylic acid and metals such as Zn, Cu, and Fe; tertiary amines such as 1,8-diazabicyclo[5.4.0]undecene-7 (DBU), triethylamine, and triethanolamine; imidazoles such as 2-ethyl-4-imidazole (2E4MZ) and 4-methylimidazole; organic phosphines such as triphenylphosphine (TPP), tributylphosphine, and tetraphenylphosphonium tetraphenylborate; and the like. These may be used singly or in combination of two or more thereof. Among them, imidazoles, particularly 2-ethyl-4-imidazole (2E4MZ), is preferably used as the catalyst because it can reduce the reaction time and suppress the polymerization between the epoxy compounds (self-polymerization of the epoxy compound). In addition, the content of the catalyst is preferably 0.05 to 1 part by mass per 100 parts by mass of the total of the polyphenylene ether and the epoxy compound. When the content of the catalyst is too small, the reaction between a hydroxyl group of the polyphenylene ether and an epoxy group of the epoxy compound tends to take a long time. In addition, when the content of the catalyst is too large, it becomes difficult to control the reaction, resulting in a tendency to easily form a gel.

The epoxy compound used in Embodiment 2 is not particularly limited as long as it is an epoxy compound having at least two epoxy groups in one molecule. That is, in the epoxy compound, the average number of epoxy groups per molecule (average number of epoxy groups) is 2 or more, preferably 2 to 7, more preferably 2 to 6. The average number of epoxy groups within the above range is preferable from the viewpoint of excellent heat resistance of the cured product from the obtained resin composition. The average number of epoxy groups herein is found from the standard value of the product of the epoxy compound to be used. Specifically, the average number of epoxy groups herein is, for example, a numerical value representing the average value of epoxy groups per molecule of all the epoxy compounds present in 1 mole of the epoxy compound.

The epoxy compound is not particularly limited as long as it is an epoxy compound used as a raw material for various substrates which can be used for producing laminated boards and circuit boards. Specifically, examples of the epoxy compound include a bisphenol type epoxy compound such as a bisphenol A type epoxy compound, a phenol novolac type epoxy compound, a cresol novolac type epoxy compound, a dicyclopentadiene type epoxy compound, a bisphenol A novolac type epoxy compound, a biphenyl aralkyl type epoxy compound, a naphthalene ring-containing epoxy compound, and the like. Among them, the epoxy compound is preferably a bisphenol type epoxy compound, a phenol novolac type epoxy compound, a cresol novolac type epoxy compound, a dicyclopentadiene type epoxy compound, and a bisphenol A novolac type epoxy compound. The epoxy compound also includes an epoxy resin which is a polymer of each epoxy compound mentioned above.

The curing agent used in Embodiment 2 is a cyanate ester compound. It is preferable to use, as the cyanate ester compound, a compound having an average number of 2 or more of cyanate groups per molecule (average number of cyanate groups). When the number of cyanate groups is large as described above, this is preferable from the viewpoint of increasing the heat resistance of the cured product from the obtained resin composition. The average number of cyanate groups of the cyanate ester compound herein can be found from the standard value of the product of the cyanate resin to be used. The number of cyanate groups of the cyanate ester compound include specifically an average value of the cyanate groups per molecule of all the cyanate resins present in 1 mole of the cyanate resin.

The cyanate ester compound is not particularly limited as long as it is a cyanate ester compound used as a raw material for various substrates that can be used for production of laminated boards and circuit boards. Specific examples of the cyanate ester include 2,2-bis(4-cyanatophenyl)propane (bisphenol A type cyanate ester compound), novolac type cyanate ester compound, bisphenol M type cyanate ester compound, bis(3,5-dimethyl-4-cyanatophenyl)methane, 2,2-bis(4-cyanatophenyl)ethane and the like. The cyanate ester compound also includes a cyanate ester resin which is a polymer of each cyanate ester described above. These may be used singly or in combination of two or more kinds thereof.

The content of the polyphenylene ether compound is preferably 20 to 50 parts by mass, more preferably 25 to 45 parts by mass, per 100 parts by mass of the total of the polyphenylene ether compound, the epoxy compound, and the cyanate ester compound. Further, the content of the epoxy compound is preferably 20 to 50 parts by mass, more preferably 25 to 50 parts by mass, per 100 parts by mass of the total of the of the polyphenylene ether compound, the epoxy compound, and the cyanate ester compound. In addition, the content of the cyanate ester compound is preferably 20 to 50 parts by mass, more preferably 20 to 40 parts by mass, per 100 parts by mass of the total of the polyphenylene ether compound, the epoxy compound, and the cyanate ester compound. When each content of the polyphenylene ether compound, the epoxy compound and the cyanate ester compound is within the above range, a resin composition whose cured product is more excellent in heat resistance and flame retardancy can be obtained. This is considered to be because the curing reaction among the polyphenylene ether compound, the epoxy compound and the cyanate ester compound proceeds favorably. In the case where the reaction product is contained, it is preferable that the content of each of the polyphenylene ether compound, the epoxy compound, and the cyanate ester compound before reacting the polyphenylene ether compound and the epoxy compound is within the above range.

The flame retardant to be used in Embodiment 2 contains a compatible phosphorus compound that is compatible with a mixture of the polyphenylene ether compound, the epoxy compound and the cyanate ester compound, and a non-compatible phosphorus compound that is not compatible with the mixture described above.

The compatible phosphorus compound is not particularly limited as long as it is a phosphorus compound acting as a flame retardant and compatible with the mixture. Here, the term "compatible" refers to a state where the phosphorus compound is finely dispersed, for example, at a molecular level in the mixture of the polyphenylene ether compound, the epoxy compound, and the cyanate ester compound. Specific examples of the compatible phosphorus compound are as described above. Among them, a phosphazene compound is preferable as the compatible phosphorus compound.

The non-compatible phosphorus compound is not particularly limited as long as it is a non-compatible phosphorus compound acting as a flame retardant and not compatible with the mixture. Here, the term "non-compatible" refers to a state where the object (phosphorus compound) is not compatible in the mixture of the polyphenylene ether compound, the epoxy compound, and the cyanate ester compound, and is dispersed like islands in the mixture. Specific examples of the non-compatible phosphorus compound are as described above. Among them, a phosphinate compound is preferable as the non-compatible phosphorus compound.

The present inventors have found that the interlayer adhesion of the cured product cannot be sometimes sufficiently enhanced by merely using the compatible phosphorus compound and the non-compatible phosphorus compound in combination, as described above, that is, have found that the interlayer adhesion of the cured product cannot be sometimes sufficiently enhanced while maintaining excellent dielectric properties of the polyphenylene ether. Then, from the investigation by the present inventors, they have found that it is possible to enhance the flame retardancy, interlayer adhesion, and chemical resistance of the cured product, while maintaining excellent dielectric properties possessed by the polyphenylene ether, not only by merely using the compatible phosphorus compound and the non-compatible phosphorus compound in combination but also by adjusting these contents.

The resin composition according to Embodiment 2 may be composed of the polyphenylene ether compound, the epoxy compound, the cyanate ester compound and the flame retardant, but as long as the resin composition contains these components, the composition may further contain other components. Examples of the other components include a curing promoter, a filler, an additive, and the like.

The resin composition according to Embodiment 2 may contain a curing promoter as described above. Examples of the curing promoter include those capable of promoting the curing reaction among the polyphenylene ether compound, the epoxy compound and the cyanate ester compound, and the like. Specific examples of the curing promoter include imidazole compounds such as 2-methylimidazole, 2-ethyl-4-methylimidazole, 2-phenyl-4-methylimidazole, 2-phenylimidazole, and 1-benzyl-2-methylimidazole, organic phosphine compounds such as triphenylphosphine, tributylphosphine, and trimethylphosphine, tertiary amine compounds such as 1,8-diaza-bicyclo(5,4,0)undecene-7 (DBU), triethanolamine, and benzyldimethylamine, metal soaps, and the like. Also, the metal soap refers to a fatty acid metal salt, which may be a linear fatty acid metal salt or a cyclic fatty acid metal salt. Specific examples thereof include a linear aliphatic metal salt having 6 to 10 carbon atoms and a cyclic aliphatic metal salt having 6 to 10 carbon atoms. More specific examples thereof include aliphatic metal salts composed of linear fatty acids such as stearic acid, lauric acid, ricinoleic acid, and octylic acid, or cyclic fatty acids such as naphthenic acid and metals such as lithium, magnesium, calcium, barium, copper, and zinc. Among them, zinc octylate is preferably used. The curing promoter may be used singly or two or more thereof may be used in combination.

The resin composition according to Embodiment 2 may contain a filler such as an inorganic filler as described above. Examples of the filler include those added to enhance the heat resistance and flame retardancy of the cured product of the resin composition, and such fillers are not particularly limited. Further, by including the filler, the heat resistance and the flame retardancy can be further enhanced. Specific examples of the filler include silica such as spherical silica, metal oxides such as alumina, titanium oxide, and mica, metal hydroxides such as aluminum hydroxide and magnesium hydroxide, talc, aluminum borate, barium sulfate, calcium carbonate, and the like. Among them, the filler is preferably silica, mica, or talc, more preferably spherical silica. The fillers may be used singly or in combination of two or more thereof. The filler may be used as it is or may be used after being subjected to a surface treatment with an epoxysilane type or aminosilane type silane coupling agent.

When the filler is contained, its content is preferably 10 to 200 parts by mass, preferably 30 to 150 parts by mass, per 100 parts by mass of the total of the organic component (excluding the flame retardant) and the flame retardant.

Specific examples of the fillers and additives mentioned as the other components are as described above.

The resin composition according to Embodiment 2 is a resin composition that can provide a cured product excellent in flame retardancy and interlayer adhesion while maintaining excellent dielectric properties of polyphenylene ether. In addition, the cured product of this resin composition is also excellent in chemical resistance such as alkali resistance. Since this resin composition provides a cured product excellent in interlayer adhesion and chemical resistance, it is a substrate material suitably adapted for multilayer formation and the like.

The method for producing the resin composition is not particularly limited, and examples of the method include a method of mixing the polyphenylene ether compound, the epoxy compound, the cyanate ester compound, and the flame retardant so as to have a predetermined content, and the like. Specifically, when a varnish-like composition containing an organic solvent is obtained, a method described later and the like can be mentioned. In the case where the reaction product is contained, for example, the production method includes a reaction step of reacting at least a part of hydroxyl groups of the polyphenylene ether compound with an epoxy group of the epoxy compound, and a mixing step of mixing the reaction product obtained by the above reaction, the cyanate ester compound, and the flame retardant. The reaction step is not particularly limited as long as the polyphenylene ether compound is reacted with the epoxy compound. Specifically, the reaction step includes mixing the polyphenylene ether and the epoxy compound as described above so that the polyphenylene ether and the epoxy compound have a predetermined ratio; stirring the polyphenylene ether and the epoxy compound in an organic solvent for 10 to 60 minutes; and then heating the mixture at 80 to 110° C. for 2 to 12 hours, and the like. At that time, as described above, the catalyst may be added to a mixture of the polyphenylene ether and the epoxy compound. By doing so, the reaction product is obtained. In addition, as the mixing step, a method of mixing the reaction product, the cyanate ester compound, and the flame retardant so as to have a predetermined content can be mentioned.

By using each of the above resin compositions, a prepreg, a metal-clad laminate, a wiring board, a metal foil with a resin, and a film with a resin can be obtained as described below.

FIG. 1 is a schematic sectional view showing an example of a prepreg 1 according to an embodiment of the present invention.

As shown in FIG. 1, the prepreg 1 according to the present embodiment includes the resin composition or a semi-cured product 2 of the resin composition, and a fibrous base material 3. Examples of the prepreg 1 include those in which the fibrous base material 3 exists in the resin composition or in the semi-cured product 2. That is, the prepreg 1 includes the resin composition or the semi-cured product 2 and the fibrous base material 3 present in the resin composition or in the semi-cured product 2.

In the present embodiment, the term "semi-cured product" means one in which the resin composition has been partially cured to such an extent that the resin composition can be further cured. That is, the semi-cured product is one which is in a state where the resin composition is semi-cured (B-staged). For example, when the resin composition is heated, the viscosity gradually decreases initially, after which the curing starts, and then the viscosity gradually increases. In such a case, as the semi-curing, the state between the beginning of the viscosity rise and before the complete curing can be mentioned.

The prepreg obtained by using the resin composition according to the present embodiment may be a prepreg including a semi-cured product of the resin composition as described above or may be a prepreg including the resin composition before curing. That is, the prepreg may be a prepreg including a semi-cured product of the resin composition (the resin composition of B stage) and a fibrous base material, or may be a prepreg including the resin composition before curing (the resin composition of A stage) and a fibrous base material. Specific examples include those including a fibrous base material present in the resin composition.

When preparing the prepreg, the resin composition 2 is often prepared and used in the form of a varnish in order to impregnate the fibrous base material 3 which is a base material for forming the prepreg. That is, the resin composition 2 is usually a resin varnish prepared in a varnish state in many cases. Such a resin varnish is prepared, for example, as follows.

First, each component soluble in an organic solvent, such as a thermosetting resin, a curing agent, and a compatible type flame retardant (compatible phosphorus compound) is charged into an organic solvent and then dissolved. In this case, heating may be performed as necessary. Thereafter, components which are not dissolved in the organic solvent, for example, an inorganic filler, a non-compatible type flame retardant (non-compatible phosphorus compound) and the like which are used as necessary are added, and the resulting mixture is dispersed in a ball mill, a bead mill, a planetary mixer, a roll mill or the like until a predetermined dispersion state is reached, whereby a varnish-like composition is prepared. The organic solvent used herein is not particularly limited as long as it dissolves a polyphenylene ether compound, an epoxy compound, a cyanate ester compound, a compatible type flame retardant or the like and does not inhibit the curing reaction. Specific examples thereof include toluene, methyl ethyl ketone (MEK), and the like.

An example of the method for producing the prepreg 1 includes a method in which the fibrous base material 3 is impregnated with the resin composition 2, for example, the resin composition 2 prepared in a varnish state, followed by drying.

Specific examples of the fibrous base material 3 used in producing the prepreg 1 include glass cloth, aramid cloth, polyester cloth, glass nonwoven fabric, aramid nonwoven fabric, polyester nonwoven fabric, pulp paper, and linter paper. Incidentally, when a glass cloth is used, a laminated board having excellent mechanical strength is obtained, and thus, a glass cloth subjected to flattening treatment process is particularly preferable. As the flattening treatment process, specifically, for example, a method in which a glass cloth is continuously pressed with a press roll at an appropriate pressure so as to flatten yarns can be mentioned. Generally, the thickness of the fibrous base material used is, for example, 0.02 mm or more and 0.3 mm or less.

The fibrous base material 3 is impregnated with the resin composition 2 by dipping, coating and the like. It is also possible to repeat impregnation a plurality of times as necessary. In this case, it is also possible to finally adjust the desired composition and impregnation amount by repeating impregnation using a plurality of resin compositions having different compositions and concentrations.

The fibrous base material 3 impregnated with the resin composition 2 is heated at desired heating conditions, for example, 80° C. or more and 180° C. or less for 1 minute or more and 10 minutes or less. By heating, the prepreg 1 before curing (A stage) or the prepreg 1 in a semi-cured state (B stage) is obtained.

The cured product of the resin composition according to the present embodiment is excellent in heat resistance, flame retardancy, and interlayer adhesion. In addition, the cured product of this resin composition is also excellent in chemical resistance such as alkali resistance. Therefore, the prepreg obtained using this resin composition is excellent in heat resistance, flame retardancy, and interlayer adhesion.

This prepreg can produce a metal-clad laminate and a wiring board excellent in heat resistance, flame retardancy, and interlayer adhesion. Furthermore, among the resin compositions, when a polyphenylene ether compound or a modified polyphenylene ether compound is contained as the thermosetting resin, the cured product is excellent in heat resistance, flame retardancy, and interlayer adhesion while maintaining excellent dielectric properties of the polyphenylene ether. Accordingly, a prepreg capable of producing a metal-clad laminate and a wiring board excellent in dielectric properties, heat resistance, flame retardancy, and interlayer adhesion can be obtained.

Figure 2:
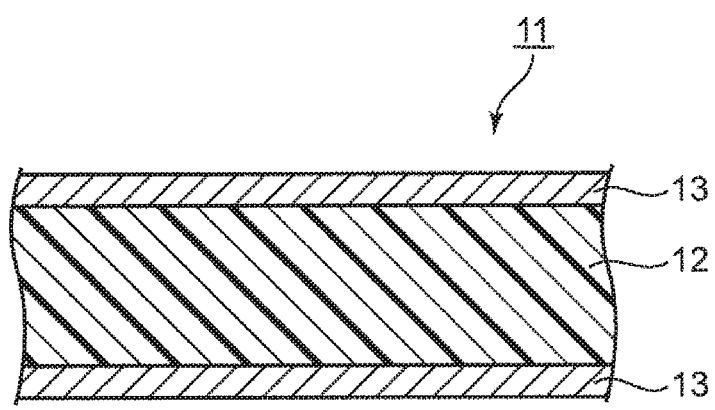
FIG. 2 is a schematic cross-sectional view showing an example of a metal-clad laminate according to an embodiment of the present invention.

FIG. 2 is a schematic sectional view showing an example of a metal-clad laminate 11 according to the embodiment of the present invention.

As shown in FIG. 2, the metal-clad laminate 11 is composed of an insulating layer 12 containing a cured product of the prepreg 1 shown in FIG. 1 and a metal foil 13 laminated together with the insulating layer 12. That is, the metal-clad laminate 11 has the insulating layer 12 containing a cured product of the resin composition, and the metal foil 13 provided on the insulating layer 12.

Examples of the method of preparing the metal-clad laminate 11 using the prepreg 1 include a method in which one or a plurality of prepregs 1 are stacked and the metal foil 13 such as a copper foil is overlaid on both upper and lower sides or one side of the prepreg 1, and the metal foil 13 and the prepreg 1 are integrally laminated by heating and press molding, and the like. By doing so, it is possible to produce a laminate 11 with double-sided metal foil cladding or single-sided metal foil cladding. That is, the metal-clad laminate 11 is obtained by laminating the metal foil 13 on the prepreg 1, followed by heating and press molding. The heating and pressurizing conditions can be appropriately set depending on the thickness of the metal-clad laminate 11 to be produced, the type of the composition of the prepreg 1, and the like. For example, the temperature can be 170° C. to 210° C., the pressure can be 1.5 to 5 MPa, and the time can be 60 to 150 minutes.

Further, the metal-clad laminate 11 may be produced by forming a varnish-like resin composition on the metal foil 13 without using the prepreg 1, and then heating and pressurizing the same.

The cured product of the resin composition according to the present embodiment is excellent in heat resistance, flame retardancy, and interlayer adhesion. In addition, the cured product of this resin composition is also excellent in chemical resistance such as alkali resistance. Therefore, the metal-clad laminate obtained using this resin composition is excellent in heat resistance, flame retardancy, and interlayer adhesion. This metal-clad laminate can produce a wiring board excellent in heat resistance, flame retardancy, and interlayer adhesion. Furthermore, when a polyphenylene ether compound or a modified polyphenylene ether compound is contained as the thermosetting resin in the resin composition, the cured product is excellent in heat resistance, flame retardancy, and interlayer adhesion while maintaining excellent dielectric properties of the polyphenylene ether. Thus, a metal-clad laminate capable of producing a wiring board excellent in dielectric properties, heat resistance, flame retardancy, and interlayer adhesion can be obtained.

Figure 3:
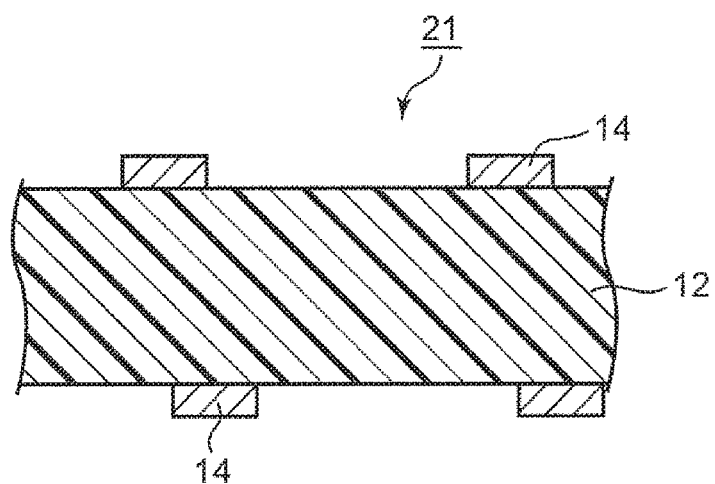
FIG. 3 is a schematic cross-sectional view showing an example of a wiring board according to an embodiment of the present invention.

FIG. 3 is a schematic sectional view showing an example of a wiring board 21 according to the embodiment of the present invention.

As shown in FIG. 3, the wiring board 21 according to the present embodiment is formed by laminating both the insulating layer 12 used by curing the prepreg 1 shown in FIG. 1 and the insulating layer 12, and a wiring 14 formed by partially removing the metal foil 13. That is, the wiring board 21 includes the insulating layer 12 containing the cured product of the resin composition, and the wiring 14 provided on the insulating layer 12.

Then, the metal foil 13 on the surface of the produced metal-clad laminate 11 is subjected to etching processing or the like to form a wiring, whereby the wiring board 21 provided with wiring as a circuit on the surface of the insulating layer 12 is obtained. That is, the wiring board 21 is obtained by circuit formation through partial removal of the metal foil 13 on the surface of the metal-clad laminate 11. The wiring board 21 has an insulating layer 12 excellent in heat resistance, flame retardancy, and interlayer adhesion. When a resin composition containing a polyphenylene ether compound or a modified polyphenylene ether compound, among the resin compositions, is used as the thermosetting resin, the insulating layer 12 in the wiring board 21 is excellent in dielectric properties, heat resistance, flame retardancy, and interlayer adhesion.

Figure 4:
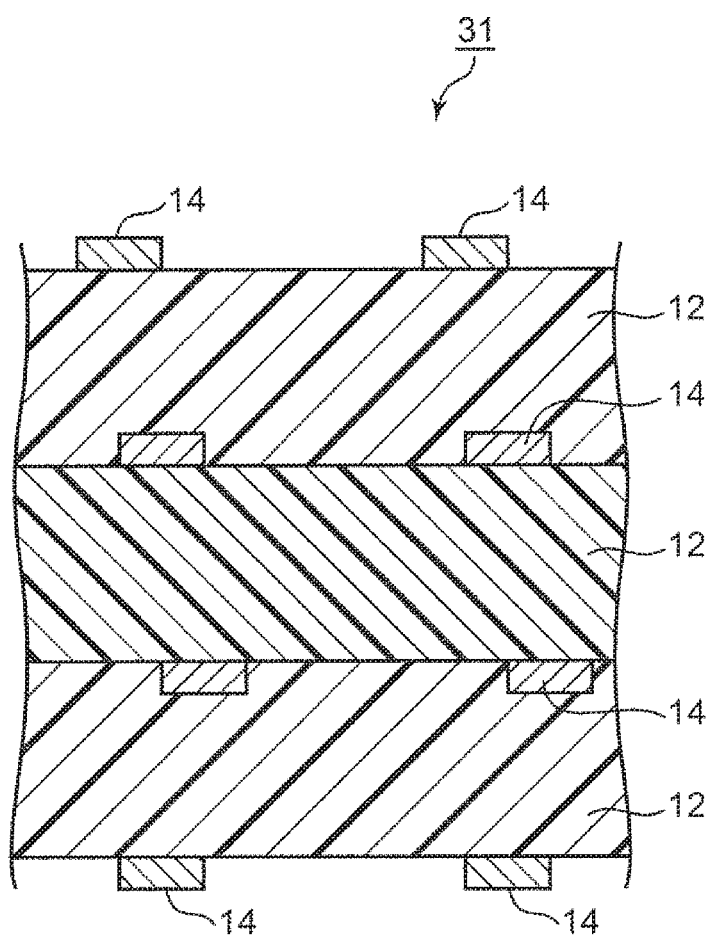
FIG. 4 is a schematic cross-sectional view showing another example of the wiring board according to the embodiment of the present invention.

FIG. 4 is a schematic sectional view showing another example of a wiring board 31 according to the embodiment of the present invention.

Further, the wiring board may have one layer of the insulating layer as shown in FIG. 3 or may have a plurality of the insulating layers as shown in FIG. 4. In the case where the wiring board has a plurality of the insulating layers, as shown in FIG. 4, the wiring may be disposed on the surface of the plurality of insulating layers or may be disposed between the insulating layers. As shown in FIG. 4, the wiring board 31 according to the present embodiment has a plurality of the insulating layers 12. In the wiring board 31, the wiring 14 is arranged between the insulating layer 12 and the insulating layer 12.

A wiring board as shown in FIG. 4 is produced, for example, as follows. The prepreg is laminated on at least one side of the wiring board as shown in FIG. 3, and if necessary, a metal foil is laminated thereon, followed by heating and pressure molding. The metal foil on the surface of the laminate thus obtained is etched or the like to form a wiring. In this way, a multilayer wiring board as shown in FIG. 4 can be produced.

Such a wiring board is a multilayer wiring board excellent in heat resistance, flame retardancy, and interlayer adhesion. Further, since the multilayer wiring board is excellent in interlayer adhesion, occurrence of peeling between the insulating layers can be suppressed even if the wiring is disposed between the insulating layers.

Figure 5:
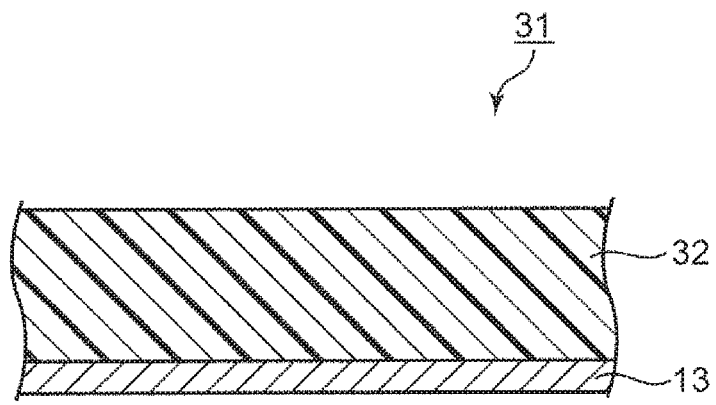
FIG. 5 is a schematic cross-sectional view showing an example of a metal foil with a resin according to an embodiment of the present invention.

FIG. 5 is a schematic sectional view showing an example of a metal foil 31 with a resin according to the present embodiment.

As shown in FIG. 5, the metal foil 31 with a resin according to the present embodiment includes a resin layer 32 containing the resin composition or a semi-cured product of the resin composition, and the metal foil 13. The metal foil 31 with a resin has the metal foil 13 on the surface of the resin layer 32. That is, the metal foil 31 with a resin includes the resin layer 32 and the metal foil 13 to be laminated together with the resin layer 32. Further, the metal foil 31 with a resin may have another layer between the resin layer 32 and the metal foil 13.

In addition, the resin layer 32 may contain a semi-cured product of the resin composition as described above or may contain the resin composition before curing. That is, the metal foil with a resin may include a metal foil and a semi-cured product of the resin composition (the resin composition of B-stage) or may include a metal foil and a resin layer containing the resin composition before curing (the resin composition of A-stage). Further, the resin layer may contain the resin composition or a semi-cured product of the resin composition and may or may not contain a fibrous base material. As the fibrous base material, the same fibrous base material as that of the prepreg can be used. The resin layer becomes an insulating layer by curing, for example, it becomes an insulating layer of a wiring board.

As the metal foil, a metal foil with a resin and a metal foil used for a metal-clad laminate can be used without limitation. Examples of the metal foil include a copper foil and an aluminum foil.

The metal foil 31 with a resin is produced, for example, by applying a varnish-like resin composition onto the metal foil 13, followed by heating. The varnish-like resin composition is applied on the metal foil 13 by using, for example, a bar coater. The applied resin composition is heated under conditions of, for example, 80° C. or more and 180° C. or less and 1 minute or more and 10 minutes or less. The heated resin composition is formed on the metal foil 13 as an uncured resin layer 32.

The cured product of the resin composition according to the present embodiment is excellent in heat resistance, flame retardancy, and interlayer adhesion. The cured product of this resin composition is also excellent in chemical resistance such as alkali resistance. Therefore, the metal foil with a resin obtained using this resin composition is excellent in heat resistance, flame retardancy, and interlayer adhesion. This metal foil with a resin can produce a wiring board excellent in heat resistance, flame retardancy, and interlayer adhesion. Furthermore, among the resin compositions, when a polyphenylene ether compound or a modified polyphenylene ether compound is contained as the thermosetting resin, the cured product is excellent in heat resistance, flame retardancy, and interlayer adhesion while maintaining excellent dielectric properties of the polyphenylene ether. Accordingly, a metal foil with a resin capable of producing a wiring board excellent in dielectric properties, heat resistance, flame retardancy, and interlayer adhesion can be obtained.

Figure 6:
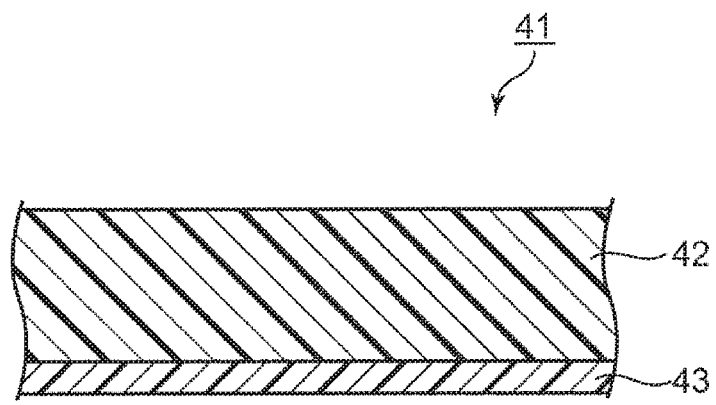
FIG. 6 is a schematic cross-sectional view showing an example of a film with a resin according to an embodiment of the present invention.

FIG. 6 is a schematic sectional view showing an example of a film 41 with a resin according to the present embodiment.

As shown in FIG. 6, the film 41 with a resin according to the present embodiment includes a resin layer 42 containing the resin composition or a semi-cured product of the resin composition, and a support film 43. The film 41 with a resin has the support film 43 on the surface of the resin layer 42. That is, the film 41 with a resin includes the resin layer 42 and the support film 43 to be laminated together with the resin layer 42. In addition, the film 41 with a resin may have another layer between the resin layer 42 and the support film 43.

In addition, the resin layer 42 may contain a semi-cured product of the resin composition as described above or may contain the resin composition before curing. That is, the resin layer 42 may include a semi-cured product of the resin composition (the resin composition of B stage) and a support film or may be a film with a resin comprising a resin layer containing the resin composition before curing (the resin composition of A stage) and a support film. In addition, the resin layer may include the resin composition or a semi-cured product of the resin composition and may or may not include a fibrous base material. As the fibrous base material, the same fibrous base material as that of the prepreg can be used. The resin layer becomes an insulating layer by curing, for example, the resin layer becomes an insulating layer of a wiring board.

As the support film 43, a support film used for a film with a resin can be used without limitation. Examples of the support film include a polyester film, a polyethylene terephthalate film, and the like.

The film with a resin 41 is produced, for example, by applying the varnish-like resin composition onto the support film 43, followed by heating. The varnish-like resin composition is applied on the support film 43, for example, by using a bar coater. The applied resin composition is heated under conditions of, for example, 80° C. or more and 180° C. or less, and 1 minute or more and 10 minutes or less. The heated resin composition is formed on the support film 43 as an uncured resin layer 42.

The cured product of the resin composition according to the present embodiment is excellent in heat resistance, flame retardancy, and interlayer adhesion. In addition, the cured product of this resin composition is also excellent in chemical resistance such as alkali resistance. Therefore, the film with a resin obtained using this resin composition is excellent in heat resistance, flame retardancy, and interlayer adhesion. With this film with a resin, a wiring board excellent in heat resistance, flame retardancy, and interlayer adhesion can be produced. Furthermore, among the resin compositions, when a polyphenylene ether compound or a modified polyphenylene ether compound is contained as the thermosetting resin, the cured product is excellent in heat resistance, flame retardancy and interlayer adhesion while maintaining excellent dielectric properties of the polyphenylene ether. Accordingly, a film with a resin capable of producing a wiring board excellent in dielectric properties, heat resistance, flame retardancy, and interlayer adhesion can be obtained.

Although the present specification discloses the techniques of various aspects as described above, the main technology among them is summarized below.

One aspect of the present invention is a resin composition comprising a thermosetting resin, a curing agent that reacts with the thermosetting resin, and a flame retardant, wherein the flame retardant contains a compatible phosphorus compound that is compatible with a mixture of the thermosetting resin and the curing agent, and a non-compatible phosphorus compound that is not compatible with the mixture, a content of the compatible phosphorus compound is 1 to 3.5 parts by mass per 100 parts by mass of a total of the thermosetting resin and the curing agent, and a content of the non-compatible phosphorus compound is 14 to 30 parts by mass per 100 parts by mass of the total of the thermosetting resin and the curing agent.

According to such a constitution, a resin composition whose cured product is excellent in flame retardancy, interlayer adhesion and chemical resistance can be provided.

In the resin composition, a content ratio of the compatible phosphorus compound and the non-compatible phosphorus compound is preferably 3:97 to 19:81 in mass ratio.

According to such a constitution, a resin composition whose cured product is excellent in flame retardancy, interlayer adhesion and chemical resistance can be provided.

In the resin composition, it is preferable that the compatible phosphorus compound is a phosphazene compound and the non-compatible phosphorus compound is a phosphinate compound.

According to such a constitution, a resin composition whose cured product is excellent in flame retardancy, interlayer adhesion and chemical resistance can be provided.

In the resin composition, it is preferable that the thermosetting resin contains a modified polyphenylene ether compound which is terminal-modified with a substituent having a carbon-carbon unsaturated double bond, and the curing agent contains a crosslinking curing agent having a carbon-carbon unsaturated double bond in a molecule.

According to such a constitution, it is possible to provide a resin composition whose cured product is excellent in heat resistance, flame retardancy, and interlayer adhesion while maintaining excellent dielectric properties of polyphenylene ether. In addition, the cured product of this resin composition is also excellent in chemical resistance such as alkali resistance. This resin composition can be a substrate material suitable for multilayering and the like, because its cured product is excellent in interlayer adhesion and chemical resistance.

In the resin composition, it is preferable that the crosslinking curing agent has a weight average molecular weight of 100 to 5000 and an average of 1 to 20 carbon-carbon unsaturated double bonds in one molecule.

According to such a constitution, it is possible to provide a resin composition whose cured product is excellent in flame retardancy, interlayer adhesion, and chemical resistance while maintaining excellent dielectric properties of polyphenylene ether.

In the resin composition, it is preferable that the crosslinking curing agent is at least one kind selected from the group consisting of a trialkenyl isocyanurate compound, a polyfunctional acrylate compound having two or more acrylic groups in a molecule, a polyfunctional methacrylate compound having two or more methacrylic groups in a molecule, and a polyfunctional vinyl compound having two or more vinyl groups in a molecule.

According to such a constitution, it is possible to provide a resin composition whose cured product is excellent in flame retardancy, interlayer adhesion, and chemical resistance while maintaining excellent dielectric properties of polyphenylene ether.

In the resin composition, it is preferable that the modified polyphenylene ether compound has a weight average molecular weight of 500 to 5000 and an average of 1 to 5 substituents in one molecule.

According to such a substitution, it is possible to provide a resin composition whose cured product is excellent in flame retardancy, interlayer adhesion, and chemical resistance while maintaining excellent dielectric properties of polyphenylene ether.

In the resin composition, it is preferable that the substituent at the terminal of the modified polyphenylene ether compound is a substituent having at least one kind selected from the group consisting of a vinylbenzyl group, an acrylate group, and a methacrylate group.

According to such a constitution, it is possible to provide a resin composition whose cured product is excellent in flame retardancy, interlayer adhesion, and chemical resistance while maintaining excellent dielectric properties of polyphenylene ether.

In the resin composition, it is preferable that a content ratio of the modified polyphenylene ether compound and the crosslinking curing agent is 90:10 to 30:70 in mass ratio.

According to such a constitution, it is possible to provide a resin composition whose cured product is excellent in flame retardancy, interlayer adhesion, and chemical resistance while maintaining excellent dielectric properties of polyphenylene ether.

In the resin composition, it is preferable that the thermosetting resin contains a polyphenylene ether compound and an epoxy compound having at least two epoxy groups in one molecule, and the curing agent contains a cyanate ester compound.

According to such a constitution, it is possible to provide a resin composition whose cured product is excellent in heat resistance, flame retardancy, and interlayer adhesion while maintaining excellent dielectric properties of polyphenylene ether. In addition, the cured product of this resin composition is also excellent in chemical resistance such as alkali resistance. This resin composition can be a substrate material suitable for multilayering and the like, because its cured product is excellent in interlayer adhesion and chemical resistance.

In the resin composition, it is preferable that the polyphenylene ether compound contains a reaction product obtained by previously reacting at least a part of hydroxyl groups of a polyphenylene ether with an epoxy group of the epoxy compound.

According to such a constitution, it is possible to provide a resin composition whose cured product is excellent in heat resistance, flame retardancy, and interlayer adhesion while maintaining excellent dielectric properties of polyphenylene ether.

In the resin composition, it is preferable that the epoxy compound is at least one kind selected from the group consisting of a bisphenol type epoxy compound, a phenol novolac type epoxy compound, a cresol novolac type epoxy compound, a dicyclopentadiene type epoxy compound, and a bisphenol A novolac type epoxy compound.

According to such a constitution, it is possible to provide a resin composition whose cured product is excellent in heat resistance, flame retardancy, and interlayer adhesion while maintaining excellent dielectric properties of polyphenylene ether.

Another aspect of the present invention is a method for producing a resin composition, comprising the steps of: reacting at least a part of hydroxyl groups of a polyphenylene ether compound with an epoxy group of an epoxy compound having at least two epoxy groups in one molecule, and mixing a reaction product obtained by the reaction, a cyanate ester compound, and a flame retardant, wherein the flame retardant contains a compatible phosphorus compound that is compatible with a mixture of the polyphenylene ether compound, the epoxy compound and the cyanate ester compound, and an non-compatible phosphorus compound that is not compatible with the mixture, a content of the compatible phosphorus compound is 1 to 3.5 parts by mass per 100 parts by mass of a total of the polyphenylene ether compound, the epoxy compound and the cyanate ester compound, and a content of the non-compatible phosphorus compound is 14 to 30 parts by mass per 100 parts by mass of the total of the polyphenylene ether compound, the epoxy compound, and the cyanate ester compound.

According to such a constitution, it is possible to suitably produce a resin composition whose cured product is excellent in heat resistance, flame retardancy, and interlayer adhesion while maintaining excellent dielectric properties of polyphenylene ether.

A prepreg according to another embodiment of the present invention is characterized by comprising the resin composition or a semi-cured product of the resin composition, and a fibrous base material.

According to such a constitution, a prepreg excellent in heat resistance, flame retardancy, and interlayer adhesion can be provided.

A film with a resin according to one embodiment of the present invention is characterized by comprising a resin layer containing the resin composition or a semi-cured product of the resin composition, and a support film.

According to such a constitution, a film with a resin having excellent heat resistance, flame retardancy, and interlayer adhesion can be provided.

A metal foil with a resin according to one embodiment of the present invention is characterized by comprising a resin layer containing the resin composition or a semi-cured product of the resin composition, and a metal foil.

According to such a constitution, it is possible to provide a metal foil with a resin, which has excellent heat resistance, flame retardancy, and interlayer adhesion.

A metal-clad laminate according to another embodiment of the present invention is characterized by comprising an insulating layer containing a cured product of the resin composition, and a metal foil.

According to such a constitution, a metal-clad laminate excellent in heat resistance, flame retardancy, and interlayer adhesion can be provided.

A wiring board according to another embodiment of the present invention is characterized by comprising an insulating layer containing a cured product of the resin composition, and a wiring.

According to such a constitution, it is possible to provide a wiring board excellent in heat resistance, flame retardancy, and interlayer adhesion.

In the wiring board, it is preferable that the wiring board has a plurality of the insulating layers, and the wiring is disposed between the insulating layers.

According to such a constitution, it is possible to provide a multilayer wiring board excellent in heat resistance, flame retardancy, and interlayer adhesion. Specifically, since the multilayer wiring board has excellent interlayer adhesion, occurrence of delamination between the insulating layers can be suppressed even if the wiring is disposed between the insulating layers.

Hereinafter, the present invention will be described more specifically with reference to Examples, but the scope of the present invention is not limited thereto.

EXAMPLES

Example X

First, Examples according to Embodiment 1 will be described.

Examples X1 to X10 and Comparative Examples X1 to X11

In the present Examples, each component used in preparing a resin composition will be described.
(Polyphenylene Ether Compound: PPE Component)
Modified PPE-1: a modified polyphenylene ether compound obtained by modifying terminal hydroxyl groups of polyphenylene ether with methacrylic groups (a modified polyphenylene ether compound having a structure shown by the formula (22), SA 9000 manufactured by SABIC Innovative Plastics Corporation, weight average molecular weight Mw 1700, 2 terminal functional groups) Modified PPE-2: a modified polyphenylene ether compound obtained by reacting polyphenylene ether and chloromethylstyrene.

Specifically, the PPE compound is a modified polyphenylene ether compound obtained by the following reaction.

First, 200 g of polyphenylene ether (SA 90, number of terminal hydroxyl groups: 2, weight average molecular weight Mw: 1700, manufactured by SABIC Innovative Plastics Co., Ltd.), 30 g of a mixture of p- and m-chloromethylstyrenes in a mass ratio of 50:50 (chloromethylstyrene: CMS manufactured by Tokyo Chemical Industry Co., Ltd.), 1.227 g of tetra-n-butylammonium bromide as a phase-transfer catalyst, and 400 g of toluene were placed in a 1 liter three-necked flask equipped with a temperature controller, a stirrer, a cooling facility and a dropping funnel, and the mixture was stirred. Then, stirring was continued until the polyphenylene ether, chloromethylstyrene, and tetra-n-butylammonium bromide were dissolved in toluene. During the stirring process, the contents were gradually heated until the solution temperature reached 75° C. finally. Then, as the alkali metal hydroxide, an aqueous solution of sodium hydroxide (20 g of sodium hydroxide/20 g of water) was dropped in the solution over 20 minutes. Then, the solution was further stirred for 4 hours at 75° C. Subsequently, the contents of the flask were neutralized with 10% by mass of hydrochloric acid, and then a large amount of methanol was added thereto. By doing so, precipitates were formed in the liquid in the flask. In other words, the product contained in the reaction solution in the flask was reprecipitated. Then, this precipitate was taken out by filtration, washed three times with a mixed solution of methanol and water in a mass ratio of 80:20, and then dried at 80° C. for 3 hours under reduced pressure.

The obtained solid was analyzed with $^1$H-NMR (400 MHz, CDCl$_3$, TMS). As a result of NMR measurement, a peak due to a vinylbenzyl group (ethenylbenzyl group) was confirmed at 5 to 7 ppm. As a result, it was confirmed that the obtained solid was a modified polyphenylene ether compound having a vinylbenzyl group in the molecule as the substituent at the molecular terminal. Specifically, the resulting solid was confirmed to be an ethenyl-benzylated polyphenylene ether. The resulting modified polyphenylene ether compound is a modified polyphenylene ether compound having a structure represented by the formula (18).

In addition, the number of terminal functional groups of the modified polyphenylene ether compound was measured as follows.

First, the modified polyphenylene ether compound is accurately weighed. Let the weight at that time be X (mg). The weighed modified polyphenylene ether was dissolved in 25 ml of methylene chloride. To the solution was added a 100 μl ethanol solution of 10% by mass of tetraethylammonium hydroxide (TEAH) (TEAH:ethanol (volume ratio)=15:85). Then, the absorbance (Abs) at 318 nm was measured by a UV spectrophotometer (UV-1600 manufactured by Shimadzu Corporation). From the measurement result, the number of terminal hydroxyl groups in the modified polyphenylene ether compound was calculated using the following formula.

Amount of residual OH(μmol/g)=[(25×Abs)/(ε× OPL×$X$)]×10$^6$

In the formula, ε represents an absorption coefficient of 4700 L/mol·cm, and OPL is an optical path length of 1 cm.

Since the calculated amount of residual OH (the number of terminal hydroxyl groups) in the modified polyphenylene ether is almost zero, it was found that most of the hydroxyl groups in the unmodified polyphenylene ether was modified. From the above description, it was understood that the decrease from the number of terminal hydroxyl groups in the polyphenylene ether before modification was the number of terminal hydroxyl groups in the polyphenylene ether before modification. In other words, the number of terminal hydroxyl groups in the unmodified polyphenylene ether corresponds to the number of terminal functional groups in the modified polyphenylene ether. In other words, the number of terminal functional groups was 2.

In addition, the intrinsic viscosity (IV) of the modified polyphenylene ether in the methylene chloride at 25° C. was measured. Specifically, the intrinsic viscosity (IV) of the modified polyphenylene ether compound was measured with a viscometer (AVS 500 Visco System, manufactured by Schott, Inc.) under the conditions of at 0.18 g/45 ml of methylene chloride solution (solution temperature: 25° C.) of the modified polyphenylene ether. The intrinsic viscosity (IV) of the modified polyphenylene ether was found to be 0.086 dl/g.

The molecular weight distribution of the modified polyphenylene ether was measured using GPC. The resultant molecular weight distribution was used to calculate the weight average molecular weight (Mw) of the modified polyphenylene ether, which was found to be 1900.

(Crosslinking Curing Agent)

TAIC: Triallyl isocyanurate (TAIC manufactured by Nippon Kasci Chemical Co., Ltd. weight average molecular weight Mw: 249, number of terminal double bonds: 3)

DVB: Divinylbenzene (DVB manufactured by Nippon Steel & Sumitomo Metal Corporation, number of terminal double bonds: 2)

(Compatible Phosphorus Compound)

Phosphoric acid ester compound: Aromatic condensed phosphoric acid ester compound (PX-200 manufactured by Daihachi Chemical Industry Co., Ltd., phosphorus concentration: 9% by mass)

Phosphazene compound: Cyclic phosphazene compound (SPB-100, manufactured by Otsuka Chemical Co., Ltd.: phosphorus concentration 13% by mass)

(Non-Compatible Phosphorus Compound)

Phosphinate compound: Aluminum tris(diethylphosphinate) (Exolit OP-935 manufactured by Clariant Japan K.K., phosphorus concentration: 23% by mass)

Diphenylphosphine oxide compound: Paraxylylene bis-diphenylphosphine oxide (PQ 60 manufactured by Dai-ichi Kogyo Seiyaku Co., Ltd. phosphorus concentration: 12% by mass).

(Reaction Initiator)

Peroxide: 1,3-bis(butylperoxyisopropyl)benzene (Perbutyl P manufactured by NOF CORPORATION)

(Inorganic Filler)

Silica: SC2500-SVJ manufactured by Admatechs Co., Ltd.

[Preparation Method]

First, each component was added to toluene at a compounding ratio shown in Table 1 so that the solid content concentration became 60% by mass and then mixed together. The mixture was stirred for 60 minutes to obtain a varnish-like resin composition (varnish).

Next, glass cloth (#7628 E-glass manufactured by Nitto Boseki Co., Ltd.) was impregnated with the obtained varnish, and the resulting material was then heated and dried at 100 to 170° C. for about 3 to 6 minutes to obtain a prepreg. At that time, the content of each of the components constituting the resin (resin content) formed by a curing reaction, such as a polyphenylene ether compound such as modified polyphenylene ether compound and a crosslinking curing agent was adjusted to about 40% by mass.

Then, four sheets of the prepreg thus obtained were laminated and heated and pressed under the conditions of a temperature of 200° C. for 2 hours under a pressure of 3 MPa to obtain an evaluation substrate with a predetermined thickness. Specifically, for example, four sheets of each obtained prepreg were stacked and laminated to obtain an evaluation substrate having a thickness of about 0.8 mm.

Each prepreg and evaluation substrate prepared as described above were evaluated by the following method.

[Flame Retardancy]

A test piece having a length of 125 mm and a width of 12.5 mm was cut out of the evaluation substrate and subjected to a flame test according to "Test for Flammability of Plastic Materials-UL 94" by Underwriters Laboratories. As a result, when the test piece was at "V-0" level, its inflammability was evaluated as "Good", and when the test piece was equivalent to or lower than "V-1" level, its inflammability was evaluated as "Poor".

[Interlayer Adhesion]

(Interlayer Adhesion-1)

First, the multilayered metal-clad laminate obtained by laminating the prepreg was allowed to stand for 24 hours under conditions of a temperature of 85° C. and a relative humidity of 85%. The prepreg on the uppermost surface of the multilayered metal-clad laminate after moisture absorption was peeled off. At that time, a normal adhesion state of the multilayered metal-clad laminate was evaluated as "Good" and an abnormal adhesion state of the multilayered metal-clad laminate was evaluated as "Poor". In addition, although the multilayered metal-clad laminate was in a state where it was adhered all over, but when there is a part in an abnormal adhesion state in the multilayered metal-clad laminate, such a case was evaluated as "Fair". The normal adhesion state refers to a state where the adhesive strength between the prepregs constituting the multilayered metal-clad laminate is high, and when trying to peel off the prepreg on the uppermost surface, peeling does not occur at the interface of the prepregs, but such peeling occurs between the prepreg resin and the glass cloth. Further, the abnormal adhesion state is an adhesion state other than the normal adhesion state. Specifically, for example, the abnormal adhesion state refers to a state where the prepreg peels off at the interface between the prepregs constituting the multilayered metal-clad laminate when trying to peel off the prepreg on the uppermost surface.

(Interlayer Adhesion-2)

First, an insulating layer obtained by curing the prepreg was used as a core material, and this core material was left for 24 hours under conditions of a temperature of 85° C. and a relative humidity of 85%. The prepreg on the uppermost surface of the multilayered metal-clad laminate obtained by laminating the prepreg on the core material after moisture absorption was peeled off. At that time, a normal adhesion state of the multilayered metal-clad laminate was evaluated as "Good" and an abnormal adhesion state of the multilayered metal-clad laminate was evaluated as "Poor". In addition, although the multilayered metal-clad laminate was in a state where it was adhered all over, but when there is a part in an abnormal adhesion state in the multilayered metal-clad laminate, such a case was evaluated as "Fair". The normal adhesion state refers to a state where the adhesive strength between the prepregs constituting the multilayered metal-clad laminate is high, and when trying to peel off the prepreg on the uppermost surface, peeling does not occur at the interface of the prepregs, but such peeling occurs between the prepreg resin and the glass cloth. Further, the abnormal adhesion state is an adhesion state other than the normal adhesion state. Specifically, the abnormal adhesion state refers to a state where the prepreg peels off at the interface between the prepregs constituting the multilayered metal-clad laminate when trying to peel off the prepreg on the uppermost surface.

[Glass Transition Temperature (Tg)]

The Tg of the prepreg was measured using a viscoelastic spectrometer "DMS 100" manufactured by Seiko Instruments Inc. At that time, the dynamic viscoelasticity measurement (DMA) was performed with a frequency of 10 Hz in the bending module, and the temperature at which the tan δ exhibited the maximum when the temperature was raised from room temperature to 280° C. at a temperature rise rate of 5° C./min was taken as Tg.

[Dielectric Properties (Relative Dielectric Constant and Dielectric Loss Tangent]

The relative dielectric constant and dielectric loss tangent of the evaluation substrate at 1 GHz were measured by a method in accordance with IPC-TM 650-2.5.5.9. Specifically, the relative dielectric constant and the dielectric loss tangent of the evaluation substrate at 1 GHz were measured using an impedance analyzer (RF impedance analyzer HP 4291B manufactured by Agilent Technologies Japan Ltd.).

[Alkali Resistance]

After the evaluation substrate was treated with chemicals, the substrate was visually observed. As a result, when the color change could not be confirmed, the substrate was evaluated as "Good"; when a slight color change could be confirmed, the substrate was evaluated as "Fair"; and when an apparent color change could be confirmed, the substrate was evaluated as "Poor".

The results of each evaluation are shown in Table 1.

TABLE 1

| | | Examples | | | | | | | | | | Comparative Examples |
|---|---|---|---|---|---|---|---|---|---|---|---|---|
| | | X1 | X2 | X3 | X4 | X5 | X6 | X7 | X8 | X9 | X10 | X1 |
| PPE | Modified PPE-1 | 70 | — | 70 | 70 | 70 | 70 | 70 | 70 | 70 | 70 | 70 |
| | Modified PPE-2 | — | 70 | — | — | — | — | — | — | — | — | — |
| Crosslinking curing agent | TAIC | 30 | 30 | 30 | 30 | 30 | 30 | — | 30 | 30 | — | 30 |
| | DVB | — | — | — | — | — | — | 30 | — | — | 30 | — |
| Compatible phosphorus compound | Phosphoric acid ester compound | — | — | — | — | — | — | — | 3.0 | 1.0 | — | 5.0 |
| | Phosphazene compound | 2.0 | 2.0 | 1.0 | 3.5 | 1.0 | 3.5 | 2.0 | — | — | 1.0 | — |
| Non-compatible phosphorus compound | Phosphinate compound | 17 | 17 | 14 | 30 | 30 | 15 | 17 | 20 | 30 | — | 25 |
| | Diphenylphosphine oxide compound | — | — | — | — | — | — | — | — | — | 30 | — |
| Reaction initiator | Perbutyl P | 2 | 2 | 2 | 2 | 2 | 2 | 2 | 2 | 2 | 2 | 2 |
| Inorganic filler | Silica | 100 | 100 | 100 | 100 | 100 | 100 | 100 | 100 | 100 | 100 | 100 |
| Compatible compound:non-compatible compound (mass ratio) | | 11:89 | 11:89 | 7:93 | 10:90 | 3:97 | 19:81 | 11:89 | 13:87 | 3:97 | 3:97 | 17:83 |
| Flame retardancy | | Good | Good | Good | Good | Good | Good | Good | Good | Good | Good | Good |
| Interlayer adhesion-1 | | Good | Good | Good | Good | Good | Good | Good | Fair | Good | Good | Poor |
| Interlayer adhesion-2 | | Good | Good | Good | Good | Fair | Good | Good | Fair | Fair | Good | Poor |
| Glass transition temperature (° C.) | | 240 | 220 | 240 | 240 | 240 | 240 | 210 | 240 | 240 | 240 | 240 |
| Relative dielectric constant | | 3.8 | 3.8 | 3.8 | 3.9 | 3.9 | 3.8 | 3.8 | 3.8 | 3.9 | 3.8 | 3.8 |
| Dielectric loss tangent | | 0.002 | 0.002 | 0.002 | 0.003 | 0.003 | 0.002 | 0.002 | 0.002 | 0.003 | 0.002 | 0.002 |
| Alkali resistance | | Good | Good | Good | Good | Good | Good | Good | Good | Good | Good | Good |

| | | Comparative Examples | | | | | | | | | |
|---|---|---|---|---|---|---|---|---|---|---|---|
| | | X2 | X3 | X4 | X5 | X6 | X7 | X8 | X9 | X10 | X11 |
| PPE | Modified PPE-1 | 70 | 70 | 70 | 70 | 70 | 70 | 70 | 70 | 70 | 70 |
| | Modified PPE-2 | — | — | — | — | — | — | — | — | — | — |
| Crosslinking curing agent | TAIC | 30 | 30 | 30 | 30 | 30 | 30 | 30 | 30 | 30 | 30 |
| | DVB | — | — | — | — | — | — | — | — | — | — |
| Compatible phosphorus compound | Phosphoric acid ester compound | 30 | — | — | — | — | — | — | — | — | — |
| | Phosphazene compound | — | 0.5 | 4.0 | 3.5 | 0.5 | 6.0 | 0.5 | 4.0 | — | 3.5 |
| Non-compatible phosphorus compound | Phosphinate compound | — | 35 | 35 | 12 | 12 | 12 | 30 | 30 | 30 | — |
| | Diphenylphosphine oxide compound | — | — | — | — | — | — | — | — | — | — |
| Reaction initiator | Perbutyl P | 2 | 2 | 2 | 2 | 2 | 2 | 2 | 2 | 2 | 2 |
| Inorganic filler | Silica | 100 | 100 | 100 | 100 | 100 | 100 | 100 | 100 | 100 | 100 |
| Compatible compound:non-compatible compound (mass ratio) | | 100:0 | 1:99 | 10:90 | 23:77 | 4:96 | 4:96 | 2:98 | 12:88 | 0:100 | 100:0 |
| Flame retardancy | | Good | Good | Good | Poor | Poor | Good | Poor | Good | Poor | Poor |
| Interlayer adhesion-1 | | Poor | Good | Poor | Good | Good | Poor | Good | Poor | Good | Good |
| Interlayer adhesion-2 | | Poor | Good | Poor | Fair | Good | Poor | Good | Poor | Good | Good |
| Glass transition temperature (° C.) | | 240 | 240 | 240 | 240 | 240 | 240 | 240 | 240 | 240 | 240 |
| Relative dielectric constant | | 3.8 | 4 | 4 | 3.8 | 3.8 | 3.8 | 3.9 | 3.9 | 3.8 | 3.8 |
| Dielectric loss tangent | | 0.002 | 0.004 | 0.004 | 0.002 | 0.002 | 0.002 | 0.003 | 0.003 | 0.002 | 0.002 |
| Alkali resistance | | Good | Fair | Fair | Good | Good | Good | Good | Good | Good | Good |

As can be seen from Table 1, when using resin compositions containing a modified polyphenylene ether compound, a crosslinking curing agent, and further, as a flame retardant, 1 to 3.5 parts by mass of a compatible phosphorus compound and 14 to 30 parts by mass of an non-compatible phosphorus compound per 100 parts by mass of the total of the modified polyphenylene ether compound and the crosslinking curing agent (Examples X1 to X10), cured products are more excellent in dielectric properties, flame retardancy, interlayer adhesion and alkali resistance, compared with the case where other resin compositions were used (Comparative Examples X1 to X11). Specifically, when the content of the compatible phosphorus compound exceeds 3.5 parts by mass (Comparative Examples X1, X2, X4, X7, and X9), the interlayer adhesion tended to decrease. In the case where the content of the non-compatible phosphorus compound exceeds 30 parts by mass (Comparative Examples X3 and X4), the dielectric properties and alkali resistance tended to decrease. In the case where the content of the non-compatible phosphorus compound is less than 14 parts by mass (Comparative Example X5, X6, X8, and X11) or the content of the compatible phosphorus compound is less than 1 part by mass (Comparative Example X6, X8, and X10), the flame retardancy tended to decrease. In Comparative Example X2 not containing a non-compatible phosphorus compound, since only a compatible phosphorus compound is contained so as to sufficiently exhibit flame retardancy, excellent flame retardancy was secured, but the interlayer adhesion decreased. From these facts, it has been found that a cured product of a resin composition containing a modified polyphenylene ether compound, a crosslinking curing agent, and further, as a flame retardant, 1 to 3.5 parts by mass of a compatible phosphorus compound and 14 to 30 parts by mass of an non-compatible phosphorus compound per 100 parts by mass of the total of the modified polyphenylene ether compound and the crosslinking curing agent is excellent in dielectric properties, interlayer adhesion, flame retardancy, and chemical resistance such as alkali resistance.

Example Y

Next, Examples according to Embodiment 2 will be described.

Examples Y1 to Y8 and Comparative Examples Y1 to Y10

In the present Example, each component used in preparing the resin composition will be described.
(Polyphenylene Ether Compound: PPE)
PPE: Polyphenylene ether (polyphenylene ether having the structure shown in the formula (29), SA 90 manufactured by SABIC Innovative Plastics Co., Ltd., intrinsic viscosity (IV): 0.083 dl/g, number of terminal hydroxyl groups: 2, weight average molecular weight Mw: 1700)
(Epoxy Compound)
Dicyclopentadiene type epoxy resin (Epiclon HP 7200 manufactured by DIC Corporation, average number of epoxy groups: 2.3)
Bisphenol A novolac type epoxy resin (Epiclon N865 manufactured by DIC Corporation, average number of epoxy groups: 5.6)
Cresol novolac type epoxy resin (Epiclon N680 manufactured by DIC Corporation, average number of epoxy groups: 6)
(Cyanate Ester Compound)
Bisphenol A type cyanate ester compound (2,2-bis(4-cyanatophenyl)propane, Badcy manufactured by Lonza Japan Co., Ltd.)
(Compatible Phosphorus Compound)
Phosphoric acid ester compound: Aromatic condensed phosphoric acid ester compound (PX-200 manufactured by Daihachi Chemical Industry Co., Ltd., phosphorus concentration: 9% by mass)
Phosphazene compound: Cyclic phosphazene compound (SPB-100, manufactured by Otsuka Chemical Co., Ltd.: phosphorus concentration: 13% by mass)
(Non-Compatible Phosphorus Compound)
Phosphinate compound: Aluminum trisdiethylphosphinate (Exolit OP-935 manufactured by Clariant Japan K.K., phosphorus concentration: 23% by mass)
Diphenylphosphine oxide compound: para-xylylene bis-diphenylphosphine oxide (PQ 60 manufactured by Dai-ichi Kogyo Seiyaku Co., Ltd., phosphorus concentration: 12% by mass).
(Metal Soap)
Zinc octanoate (manufactured by DIC Corporation)
(Inorganic filler)
Silica: SC2500-SEJ manufactured by Admatechs Co., Ltd.
[Preparation Method]
First, each component was added to toluene at a compounding ratio (parts by mass) shown in Table 2 so that the solid content concentration became 60% by mass and then mixed together. The mixture was stirred for 60 minutes to obtain a varnish-like resin composition (varnish).
Next, glass cloth (#7628 E-glass manufactured by Nitto Boseki Co., Ltd.) was impregnated with the obtained varnish, and then the resulting material was dried under heating at 100 to 170° C. for about 3 to 6 minutes to obtain a prepreg. At that time, the content of the components (resin content), such as a polyphenylene ether compound, an epoxy compound, and a cyanate ester compound that constitute the resin by a curing reaction, was adjusted to about 40% by mass.
Then, four sheets of each prepreg thus obtained were stacked and laminated, and then heated and pressed under the conditions of a temperature of 200° C. for 2 hours at a pressure of 3 MPa to obtain an evaluation substrate with a predetermined thickness. Specifically, for example, four sheets of each prepregs thus obtained were stacked and laminated to obtain an evaluation substrate having a thickness of about 0.8 mm.
Each prepreg and evaluation substrate prepared as described above were evaluated by the following method.
[Flame Retardancy]
A test piece having a length of 125 mm and a width of 12.5 mm was cut out of the evaluation substrate and subjected to a flame test according to "Test for Flammability of Plastic Materials-UL 94" by Underwriters Laboratories. As a result, when the test piece was at "V-0" level, its inflammability was evaluated as "Good", and when the test piece was equivalent to or lower than "V-1" level, its inflammability was evaluated as "Poor".
[Interlayer Adhesion (Interlayer Adhesion Strength)]
Peeling strength (interlayer adhesion strength) between the prepregs of the evaluation substrate was measured in accordance with JMS C 6481. At this time, a pattern having a width of 10 mm and a length of 100 mm was formed on a test piece having a width of 20 mm and a length of 100 mm, and the prepreg on the uppermost surface was peeled off at a speed of 50 mm/min by a tensile tester. The peeling strength (N/mm) at that time was measured as the interlayer adhesion strength.

[Heat Resistance (Moisture Absorption Soldering Heat Resistance)]

The moisture absorption soldering heat resistance was measured by a method in accordance with JIS C 6481. Specifically, the evaluation substrate was subjected to a pressure cooker test (PCT) at 121° C. under 2 atm pressure (0.2 MPa) for 2 hours, and each sample (a sample number of 5) was immersed in a solder bath at 260° C. for 20 seconds. Then, the presence or absence of occurrence of measling or blistering was visually observed. When the occurrence of measling or blistering could not be confirmed, the sample was evaluated as "Good", and when the occurrence of measling or blistering could be confirmed, the sample was evaluated as "Poor". Separately, the same evaluation was carried out using a solder bath at 288° C. instead of a solder bath at 260° C.

[Glass Transition Temperature (Tg)]

The Tg of each prepreg was measured using a viscoelastic spectrometer "DMS 100" manufactured by Seiko Instruments Inc. At that time, the dynamic viscoelasticity measurement (DMA) was performed with a frequency of 10 Hz in the bending module, and the temperature at which the tan δ exhibited the maximum when the temperature was raised from room temperature to 280° C. at a temperature rise rate of 5° C./min was taken as Tg.

[Dielectric Properties (Relative Dielectric Constant and Dielectric Loss Tangent]

The relative dielectric constant and dielectric loss tangent of the evaluation substrate at 1 GHz were measured by a method in accordance with IPC-TM 650-2.5.5.9. Specifically, the relative dielectric constant and the dielectric loss tangent of the evaluation substrate at 1 GHz were measured using an impedance analyzer (RF impedance analyzer HP 4291B manufactured by Agilent Technologies Japan Ltd.).

[Alkali Resistance]

After the evaluation substrate was treated with chemicals, the substrate was visually observed. As a result, when the color change could not be confirmed, the substrate was evaluated as "Good"; when a slight color change could be confirmed, the substrate was evaluated as "Fair"; and when an apparent color change could be confirmed, the substrate was evaluated as "Poor".

The results of each evaluation are shown in Table 2.

TABLE 2

|  |  | Examples |  |  |  |  |  |  |  | Comparative Examples |
|---|---|---|---|---|---|---|---|---|---|---|
|  |  | Y1 | Y2 | Y3 | Y4 | Y5 | Y6 | Y7 | Y8 | Y1 |
|  | PPE | 30 | 30 | 30 | 30 | 30 | 30 | 30 | 30 | 30 |
| Epoxy compound | Dicyclopentadiene type epoxy resin | 40 | — | — | — | — | — | — | — | 40 |
|  | Bisphenol A novolak type epoxy resin | — | 40 | 40 | 40 | 40 | — | — | — | — |
|  | Cresol novolak type epoxy resin | — | — | — | — | — | 40 | 40 | 40 | — |
| Cyanate ester compound |  | 30 | 30 | 30 | 30 | 30 | 30 | 30 | 30 | 30 |
| Compatible phosphorus compound | Phosphoric acid ester compound | — | — | — | — | — | — | 3.0 | — | 20 |
|  | Phosphazene compound | 2.0 | 2.0 | 3.5 | 1.0 | 3.5 | 2.0 | — | 1.0 | — |
| Non-compatible phosphorus compound | Phosphinate compound | 17 | 17 | 30 | 30 | 15 | 17 | 20 | — | — |
|  | Diphenylphosphine oxide compound | — | — | — | — | — | — | — | 30 | — |
| Metal soap | Zinc octanoate | 0.01 | 0.01 | 0.01 | 0.01 | 0.01 | 0.01 | 0.01 | 0.01 | 0.01 |
| Inorganic filler | Silica | 125 | 125 | 125 | 125 | 125 | 125 | 125 | 125 | 125 |
| Compatible phosphorus compound:non-compatible phosphorus compound (mass ratio) |  | 11:89 | 11:89 | 10:90 | 3:97 | 19:81 | 11:89 | 13:87 | 3:97 | 100:0 |
| Flame retardancy |  | Good | Good | Good | Good | Good | Good | Good | Good | Good |
| Interlayer adhesion strength (N/mm) |  | 0.8 | 0.9 | 0.6 | 0.7 | 0.8 | 1.0 | 0.7 | 0.7 | 0.2 |
| Heat resistance | 260° C. | Good | Good | Good | Good | Good | Good | Good | Good | Poor |
|  | 288° C. | Good | Good | Poor | Poor | Good | Good | Good | Good | Poor |
| Glass transition temperature (° C.) |  | 190 | 195 | 185 | 195 | 185 | 200 | 190 | 200 | 130 |
| Relative dielectric constant |  | 4.3 | 4.5 | 4.5 | 4.4 | 4.4 | 4.5 | 4.4 | 4.5 | 4.4 |
| Dielectric loss tangent |  | 0.004 | 0.005 | 0.006 | 0.006 | 0.005 | 0.005 | 0.005 | 0.005 | 0.005 |
| Alkali resistance |  | Good | Good | Good | Good | Good | Good | Good | Good | Good |

|  |  | Comparative Examples |  |  |  |  |  |  |  |  |
|---|---|---|---|---|---|---|---|---|---|---|
|  |  | Y2 | Y3 | Y4 | Y5 | Y6 | Y7 | Y8 | Y9 | Y10 |
|  | PPE | 30 | 30 | 30 | 30 | 30 | 30 | 30 | 30 | 30 |
| Epoxy compound | Dicyclopentadiene type epoxy resin | 40 | 40 | 40 | 40 | 40 | 40 | 40 | 40 | 40 |
|  | Bisphenol A novolak type epoxy resin | — | — | — | — | — | — | — | — | — |
|  | Cresol novolak type epoxy resin | — | — | — | — | — | — | — | — | — |
| Cyanate ester compound |  | 30 | 30 | 30 | 30 | 30 | 30 | 30 | 30 | 30 |

TABLE 2-continued

| | | | | | | | | | | |
|---|---|---|---|---|---|---|---|---|---|---|
| Compatible phosphorus compound | Phosphoric acid ester compound | — | — | — | — | — | — | — | — | — |
| | Phosphazene compound | — | — | 15 | 0.5 | 3.5 | 5.0 | 0.5 | 1.0 | 3.5 |
| Non-compatible phosphorus compound | Phosphinate compound | 40 | 5 | — | 35 | 12 | 25 | 30 | 35 | 35 |
| | Diphenylphosphine oxide compound | — | — | — | — | — | — | — | — | — |
| Metal soap | Zinc octanoate | 0.01 | 0.01 | 0.01 | 0.01 | 0.01 | 0.01 | 0.01 | 0.01 | 0.01 |
| Inorganic filler | Silica | 125 | 125 | 125 | 125 | 125 | 125 | 125 | 125 | 125 |
| Compatible phosphorus compound:non-compatible phosphorus compound (mass ratio) | | 0:100 | 0:100 | 100:0 | 1:99 | 23:77 | 17:83 | 2:98 | 3:97 | 9:91 |
| Flame retardancy | | Good | Poor | Good | Good | Poor | Good | Poor | Good | Good |
| Interlayer adhesion strength (N/mm) | | 0.5 | 1.1 | 0.5 | 0.5 | 0.8 | 0.7 | 0.5 | 0.5 | 0.4 |
| Heat resistance | 260° C. | Poor | Good | Poor | Poor | Good | Poor | Poor | Poor | Poor |
| | 288° C. | Poor | Good | Poor | Poor | Good | Poor | Poor | Poor | Poor |
| Glass transition temperature (° C.) | | 190 | 190 | 150 | 185 | 190 | 180 | 185 | 180 | 175 |
| Relative dielectric constant | | 4.5 | 4.2 | 4.6 | 4.5 | 4.4 | 4.5 | 4.5 | 4.5 | 4.5 |
| Dielectric loss tangent | | 0.006 | 0.004 | 0.006 | 0.006 | 0.005 | 0.006 | 0.006 | 0.006 | 0.006 |
| Alkali resistance | | Poor | Good | Good | Fair | Good | Good | Good | Fair | Fair |

As can be seen from Table 2, when using resin compositions containing a polyphenylene ether compound, an epoxy compound and a cyanate ester compound, and further, as a flame retardant, 1 to 3.5 parts by mass of a compatible phosphorus compound and 14 to 30 parts by mass of a non-compatible phosphorus compound per 100 parts by mass of the total of the polyphenylene ether compound, the epoxy compound, and the cyanate ester compound (Examples Y1 to Y8), cured products are more excellent in dielectric properties, heat resistance, flame retardancy, and interlayer adhesion, compared with the case where other resin compositions were used (Comparative Examples Y1 to Y10). In addition, Examples Y1 to Y8 were found to be superior in alkali resistance as compared with Comparative Examples Y1 to Y10.

Specifically, when the content of the compatible phosphorus compound exceeds 3.5 parts by mass (Comparative Examples Y1, Y4, and Y7), the heat resistance tended to decrease. In addition, when the content of the compatible phosphorus compound exceeds 3.5 parts by mass and trying to exert flame retardancy only with the compatible phosphorus compound (Comparative Examples Y1 and Y4), there was also a tendency such that the interlayer adhesion and the glass transition temperature decrease.

In addition, when the content of the non-compatible phosphorus compound exceeds 30 parts by mass (Comparative Examples Y2, Y5, Y9, and Y10), the interlayer adhesion and heat resistance tended to decrease. Also, even in the case where the compatible phosphorus compound is not contained or the content of the compatible phosphorus compound is less than 1 part by mass, the interlayer adhesion and heat resistance tended to be lowered when trying to exhibit the flame retardancy (Comparative Examples Y2 and Y5) by including the non-compatible phosphorus compound exceeding 30 parts by mass. When the content of the non-compatible phosphorus compound exceeds 30 parts by mass (Comparative Examples Y2, Y5, Y9, and Y10), the alkali resistance tended to decrease. In particular, even if the compatible phosphorus compound is not contained, it was found that the alkali resistance was more decreased when trying to exhibit the flame retardancy in the case where the content of the non-compatible phosphorus compound exceeded 30 parts by mass (Comparative Example 2).

In addition, when the content of the compatible phosphorus compound is less than 1 part by mass and the content of the non-compatible phosphorus compound is not more than 30 parts by mass (Comparative Examples Y3 and Y8), the flame retardancy tended to decrease. In addition, when the content of the non-compatible phosphorus compound is less than 14 parts by mass and the content of the compatible phosphorus compound is not more than 3.5 parts by mass (Comparative Examples Y3 and Y6), the flame retardancy tended to decrease.

From these facts, it was found that a cured product of a resin composition containing a polyphenylene ether compound, an epoxy compound, and a cyanate ester compound, and further, as a flame retardant, 1 to 3.5 parts by mass of a compatible phosphorus compound, and 14 to 30 parts by mass of an non-compatible phosphorus compound per 100 parts by mass of the total of the polyphenylene ether compound, the epoxy compound, and the cyanate ester compound was excellent in dielectric properties, heat resistance, flame retardancy, and interlayer adhesion. Further, it was found that a cured product of such a resin composition was also excellent in chemical resistance such as alkali resistance.

Examples Y9 to Y14 and Comparative Examples Y11 to Y16

Next, a case where the polyphenylene ether compound and the epoxy compound are reacted in advance (pre-react) will be described. In other words, Examples relating to a resin composition containing a reaction product obtained by preliminarily reacting at least a part of the hydroxyl groups of the polyphenylene ether as the polyphenylene ether compound with the epoxy group of the epoxy compound will be explained.

[Preparation of Reaction Product]

PPE, the following bisphenol A type epoxy resin, and the following catalyst were added to toluene so as to have the compounding ratio (parts by mass) shown in Table 3, followed by stirring at 100° C. for 6 hours. By doing so, a reaction product in which the PPE and the bisphenol A type epoxy resin had been previously reacted (pre-reacted) was obtained. The reaction product obtained at this time contained unreacted epoxy compound.

(Epoxy Compound)

Bisphenol A type epoxy resin (Epiclon 850S manufactured by DIC Corporation, average number of epoxy groups: 2)

(Catalyst at Pre-Reaction) 2E4MZ: 2-ethyl-4-imidazole (manufactured by Shikoku Chemicals Corporation)

[Preparation of Resin Composition]

Resin compositions were obtained in the same manner as in Examples Y to Y8, except that the above reaction products were used in place of the polyphenylene ether compounds and epoxy compounds in Examples Y1 to Y8, and the compounding ratios shown in Table 3 were used.

The evaluation was carried out in the same manner as in Examples Y1 to Y8, and the results are shown in Table 3.

amples Y9 to Y14), cured products were more excellent in dielectric properties, heat resistance, flame retardancy, and interlayer adhesion, compared with the case where other resin compositions were used (Comparative Examples Y11 to Y16). In addition, Examples Y9 to Y14 were found to be superior in alkali resistance as compared with Comparative Examples Y11 to Y16. From Table 3, it was also found that a resin composition whose cured product was excellent in dielectric properties, heat resistance, flame retardancy, and interlayer adhesion could be obtained even if the polyphe-

TABLE 3

| | | | Examples | | | | | |
|---|---|---|---|---|---|---|---|---|
| | | | Y9 | Y10 | Y11 | Y12 | Y13 | Y14 |
| Composition at pre-reaction (reaction product) | | PPE | 30 | 30 | 30 | 30 | 30 | 30 |
| | Epoxy compound | Bisphenol A type epoxy compound | 40 | 40 | 40 | 40 | 40 | 40 |
| | Catalyst | 2E4MZ | 0.07 | 0.07 | 0.07 | 0.07 | 0.07 | 0.07 |
| Composition other than reaction product | Cyanate ester compound | | 30 | 30 | 30 | 30 | 30 | 30 |
| | Compatible phosphorus compound | Phosphoric acid ester compound | — | — | — | — | 3 | — |
| | | Phosphazene compound | 2.0 | 3.5 | 1.0 | 3.5 | — | 1.0 |
| | Non-compatible phosphorus compound | Phosphinate compound | 17 | 30 | 30 | 15 | 20 | — |
| | | Diphenylphosphine oxide compound | — | — | — | — | — | 30 |
| | Metal soap | Zinc octanoate | 0.01 | 0.01 | 0.01 | 0.01 | 0.01 | 0.01 |
| | Inorganic filler | Silica | 125 | 125 | 125 | 125 | 125 | 125 |
| Compatible phosphorus compound:non-compatible phosphorus compound (mass ratio) | | | 11:89 | 10:90 | 3:97 | 19:81 | 13:87 | 3:97 |
| Flame retardancy | | | Good | Good | Good | Good | Good | Good |
| Interlayer adhesion strength (N/mm) | | | 1.0 | 0.7 | 0.8 | 0.9 | 0.8 | 0.9 |
| Heat resistance | 260° C. | | Good | Good | Good | Good | Good | Good |
| | 288° C. | | Good | Poor | Poor | Good | Poor | Good |
| Glass transition temperature (° C.) | | | 195 | 190 | 200 | 190 | 185 | 200 |
| Dielectric constant | | | 4.5 | 4.5 | 4.4 | 4.4 | 4.4 | 4.4 |
| Dielectric loss tangent | | | 0.005 | 0.006 | 0.006 | 0.005 | 0.005 | 0.005 |
| Alkali resistance | | | Good | Good | Good | Good | Good | Good |

| | | | Comparative Examples | | | | | |
|---|---|---|---|---|---|---|---|---|
| | | | Y11 | Y12 | Y13 | Y14 | Y15 | Y16 |
| Composition at pre-reaction (reaction product) | | PPE | 30 | 30 | 30 | 30 | 30 | 30 |
| | Epoxy compound | Bisphenol A type epoxy compound | 40 | 40 | 40 | 40 | 40 | 40 |
| | Catalyst | 2E4MZ | 0.07 | 0.07 | 0.07 | 0.07 | 0.07 | 0.07 |
| Composition other than reaction product | Cyanate ester compound | | 30 | 30 | 30 | 30 | 30 | 30 |
| | Compatible phosphorus compound | Phosphoric acid ester compound | — | — | — | — | — | 20 |
| | | Phosphazene compound | — | 5.0 | 0.5 | 1.0 | 3.5 | — |
| | Non-compatible phosphorus compound | Phosphinate compound | 40 | 25 | 30 | 35 | 35 | — |
| | | Diphenylphosphine oxide compound | — | — | — | — | — | — |
| | Metal soap | Zinc octanoate | 0.01 | 0.01 | 0.01 | 0.01 | 0.01 | 0.01 |
| | Inorganic filler | Silica | 125 | 125 | 125 | 125 | 125 | 125 |
| Compatible phosphorus compound:non-compatible phosphorus compound (mass ratio) | | | 0:100 | 17:83 | 2:98 | 3:97 | 9:91 | 100:0 |
| Flame retardancy | | | Good | Good | Poor | Good | Good | Good |
| Interlayer adhesion strength (N/mm) | | | 0.5 | 0.7 | 0.5 | 0.5 | 0.4 | 0.3 |
| Heat resistance | 260° C. | | Poor | Poor | Poor | Poor | Poor | Poor |
| | 288° C. | | Poor | Poor | Poor | Poor | Poor | Poor |
| Glass transition temperature (° C.) | | | 185 | 175 | 180 | 175 | 170 | 150 |
| Dielectric constant | | | 4.5 | 4.5 | 4.5 | 4.5 | 4.5 | 4.4 |
| Dielectric loss tangent | | | 0.006 | 0.006 | 0.006 | 0.006 | 0.006 | 0.005 |
| Alkali resistance | | | Poor | Good | Good | Fair | Fair | Good |

It was found from Table 3 that when using resin compositions containing a polyphenylene ether compound, an epoxy compound and a cyanate ester compound, and further, as a flame retardant, 1 to 3.5 parts by mass of a compatible phosphorus compound, and 14 to 30 parts by mass of an non-compatible phosphorus compound per 100 parts by mass of the total of the polyphenylene ether compound, the epoxy compound, and the cyanate ester compound (Exnylene ether compound and the epoxy compound were previously reacted. That is, resin compositions whose cured products are excellent in dielectric properties, heat resistance, flame retardancy, and interlayer adhesion were obtained when such resin compositions contain a polyphenylene ether compound, an epoxy compound and a cyanate ester compound, and further, as a flame retardant, 1 to 3.5 parts by mass of a compatible phosphorus compound and 14 to 30 parts by mass of a non-compatible phosphorus compound per 100 parts by mass of the total of the polyphenylene ether compound, the epoxy compound, and the cyanate ester compound (Examples Y9 to Y14), even in the case where the polyphenylene ether compound and the epoxy compound were reacted in advance. In addition, when pre-reacting a polyphenylene ether compound with an epoxy compound (Examples Y9 to Y14), it was found that there was a tendency that interlayer adhesion was higher when compared to the case where pre-reaction was not performed (Examples Y2 to Y5).

This application is based on Japanese Patent Application No. 2016-203510 filed on Oct. 17, 2016 and Japanese Patent Application No. 2017-002290 filed on Jan. 11, 2017, the contents of which are included in the present application.

In order to embody the present invention, the present invention has been appropriately and adequately explained by means of the specific embodiments, but it should be recognized that a person skilled in the art could easily modify and/or improve the embodiments. Therefore, as long as modifications or improvements carried out by a person skilled in the art do not depart from the scope of the claims described in the patent claims of the present invention, these modifications or improvements are interpreted as being encompassed by the scope of the claims.

INDUSTRIAL APPLICABILITY

According to the present invention, it is possible to provide a resin composition whose cured product is excellent in heat resistance, flame retardancy, and interlayer adhesion, and a method for producing the resin composition. In addition, according to the present invention, there are provided a prepreg, a film with a resin, a metal foil with a resin, a metal-clad laminate, and a wiring board, with use of the resin composition.

The invention claimed is:

1. A resin composition comprising:
a thermosetting resin;
a curing agent that reacts with the thermosetting resin;
silica; and
a flame retardant,
wherein
the thermosetting resin contains a modified polyphenylene ether compound which is terminal-modified with a substituent having a carbon-carbon unsaturated double bond,
the curing agent contains at least one kind selected from the group consisting of a trialkenyl isocyanurate compound and a polyfunctional vinyl compound having two or more vinyl groups in a molecule,
the flame retardant contains a compatible phosphorus compound that is compatible with a mixture of the thermosetting resin and the curing agent, and a non-compatible phosphorus compound that is not compatible with the mixture,
the compatible phosphorus compound contains at least one kind selected from the group consisting of a phosphoric acid ester compound and a phosphazene compound,
the non-compatible phosphorus compound contains at least one kind selected from the group consisting of a phosphinate compound and a diphenylphosphine oxide compound,
a content of the compatible phosphorus compound is 1 to 3.5 parts by mass per 100 parts by mass of a total of the thermosetting resin and the curing agent,
a content of the non-compatible phosphorus compound is 14 to 30 parts by mass per 100 parts by mass of the total of the thermosetting resin and the curing agent,
a content ratio of the compatible phosphorus compound and the non-compatible phosphorus compound is 3:97 to 19:81 in mass ratio, and
a content of the modified polyphenylene ether compound is 30 to 90 parts by mass per 100 parts by mass of the total of the modified polyphenylene ether compound and the curing agent.

2. The resin composition according to claim 1, wherein
the compatible phosphorus compound contains a phosphazene compound, and
the non-compatible phosphorus compound contains a phosphinate compound.

3. The resin composition according to claim 1, wherein the curing agent has a weight average molecular weight of 100 to 5000 and an average of 1 to 20 carbon-carbon unsaturated double bonds in one molecule.

4. The resin composition according to claim 1, wherein the modified polyphenylene ether compound has a weight average molecular weight of 500 to 5000 and an average of 1 to 5 substituents in one molecule.

5. The resin composition according to claim 1, wherein the substituent at the terminal of the modified polyphenylene ether compound contains a substituent having at least one kind selected from the group consisting of a vinylbenzyl group, an acrylate group, and a methacrylate group.

6. A method for producing the resin composition according to claim 1, comprising the:
mixing the thermosetting resin, the curing agent, and the flame retardant.

7. A prepreg comprising the resin composition according to claim 1 or a semi-cured product of the resin composition and a fibrous base material.

8. A film with a resin, comprising a resin layer containing the resin composition according to claim 1 or a semi-cured product of the resin composition, and a support film.

9. A metal foil with a resin, comprising a resin layer containing the resin composition according to claim 1 or a semi-cured product of the resin composition, and a metal foil.

10. A metal-clad laminate comprising an insulating layer containing a cured product of the resin composition according to claim 1, and a metal foil.

11. A wiring board comprising an insulating layer containing a cured product of the resin composition according to claim 1, and a wiring.

12. The wiring board according to claim 11, wherein
the wiring board has a plurality of the insulating layers, and
the wiring is disposed between the insulating layers.

* * * * *